(12) United States Patent
Shinno

(10) Patent No.: US 10,697,069 B2
(45) Date of Patent: *Jun. 30, 2020

(54) VAPOR DEPOSITION MASK SUBSTRATE, VAPOR DEPOSITION MASK SUBSTRATE MANUFACTURING METHOD, VAPOR DEPOSITION MASK MANUFACTURING METHOD, AND DISPLAY DEVICE MANUFACTURING METHOD

(71) Applicant: TOPPAN PRINTING CO., LTD., Taito-ku, Tokyo (JP)

(72) Inventor: Mikio Shinno, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/928,357

(22) Filed: Mar. 22, 2018

(65) Prior Publication Data

US 2019/0112715 A1   Apr. 18, 2019

(30) Foreign Application Priority Data

Oct. 13, 2017   (JP) .................................. 2017-199920

(51) Int. Cl.
*C23F 1/02* (2006.01)
*B21B 1/22* (2006.01)
(Continued)

(52) U.S. Cl.
CPC ................. *C23F 1/02* (2013.01); *B21B 1/22* (2013.01); *C21D 6/001* (2013.01); *C21D 8/0205* (2013.01);
(Continued)

(58) Field of Classification Search
CPC ....... C23F 1/02; C23C 14/042; C23C 16/042; C23C 16/56; C21D 6/001; C21D 8/0205;
(Continued)

(56) References Cited

U.S. PATENT DOCUMENTS

2014/0377903 A1\* 12/2014 Takeda .................. C23C 14/042
 438/99
2016/0208392 A1   7/2016 Ikenaga et al.
(Continued)

FOREIGN PATENT DOCUMENTS

CN   104854254 A   8/2015
CN   105492654 A   4/2016
(Continued)

*Primary Examiner* — Duy Vu N Deo
(74) *Attorney, Agent, or Firm* — Squire Patton Boggs (US) LLP

(57) ABSTRACT

A metal sheet has a longitudinal direction and a width direction. The metal sheet has shapes in the width direction that are taken at different positions in the longitudinal direction of the metal sheet and differ from one another. Each of the shapes is an undulated shape including protrusions and depressions repeating in the width direction of the metal sheet. A length in the width direction of a surface of the metal sheet is a surface distance. A minimum value of surface distances at different positions in the longitudinal direction of the metal sheet is a minimum surface distance. A ratio of a difference between a surface distance and the minimum surface distance to the minimum surface distance is an elongation difference ratio in the width direction. A maximum value of elongation difference ratios is less than or equal to $2 \times 10^{-5}$.

8 Claims, 16 Drawing Sheets

(51) Int. Cl.
*C21D 6/00* (2006.01)
*C21D 8/02* (2006.01)
*C21D 9/52* (2006.01)
*C23C 14/04* (2006.01)
*C23C 16/04* (2006.01)
*C23C 16/56* (2006.01)
*C25D 1/04* (2006.01)
*C25D 1/10* (2006.01)
*C25D 3/56* (2006.01)
*C25D 1/16* (2006.01)

(52) U.S. Cl.
CPC .............. *C21D 9/52* (2013.01); *C23C 14/042* (2013.01); *C23C 16/042* (2013.01); *C23C 16/56* (2013.01); *C25D 1/04* (2013.01); *C25D 1/10* (2013.01); *C25D 1/16* (2013.01); *C25D 3/562* (2013.01)

(58) Field of Classification Search
CPC ... C21D 9/52; C25D 1/04; C25D 1/10; C25D 3/562; C25D 1/16; B21B 1/22
See application file for complete search history.

(56) References Cited

U.S. PATENT DOCUMENTS

| | | | |
|---|---|---|---|
| 2016/0237546 A1* | 8/2016 | Ikenaga | ................ C23C 14/042 |
| 2017/0092862 A1* | 3/2017 | Obata | ................... C23C 14/042 |
| 2018/0312979 A1 | 11/2018 | Shinno et al. | |
| 2019/0112699 A1 | 4/2019 | Shinno | |

FOREIGN PATENT DOCUMENTS

| | | |
|---|---|---|
| JP | H11-229040 A | 8/1999 |
| JP | 2015-055007 A | 3/2015 |
| KR | 10-2015-0103654 A | 9/2015 |
| WO | WO 2017/179719 A1 | 10/2017 |

* cited by examiner

Fig.20A  Sheet preparation 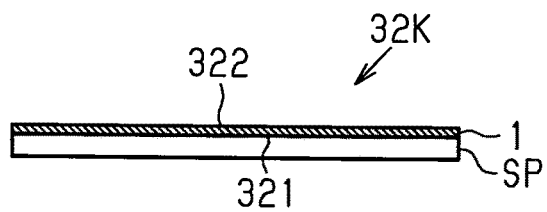
Fig.20B  Resist layer formation 
Fig.20C  Exposure and development 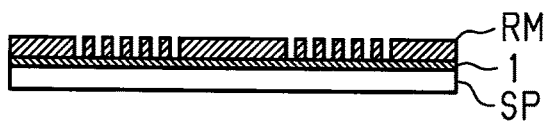
Fig.20D  Etching 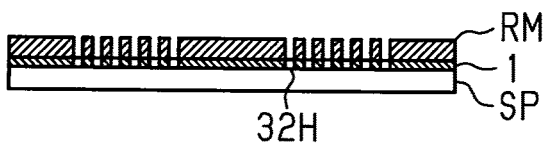
Fig.20E  Resist removal 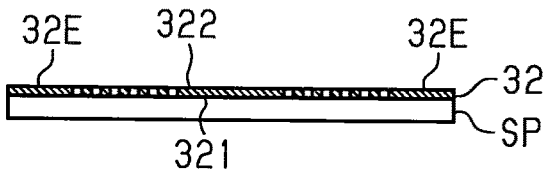
Fig.20F  Joining A 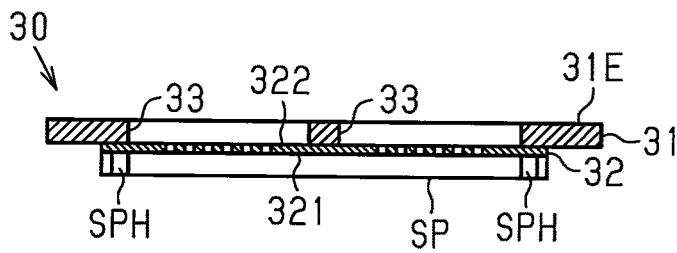
Fig.20G  Joining B 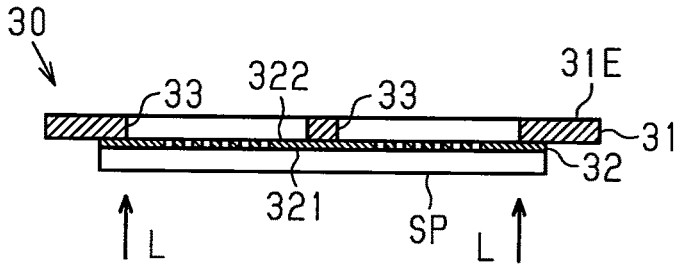
Fig.20H  Joining C 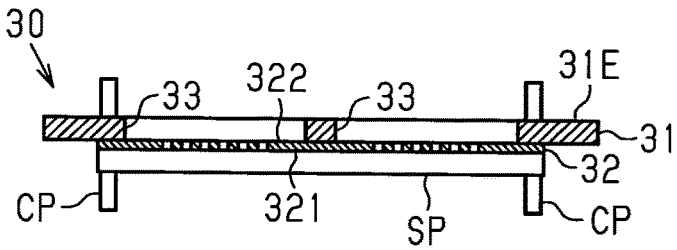

Fig.21A  Resist layer formation 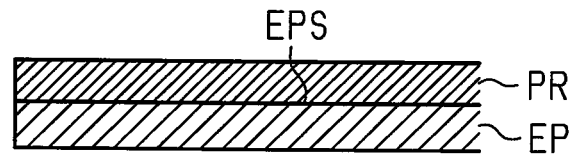
Fig.21B  Resist mask formation 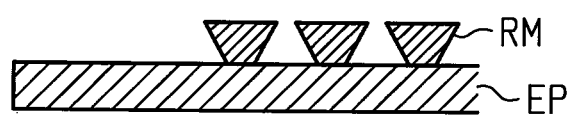
Fig.21C  Electrolysis 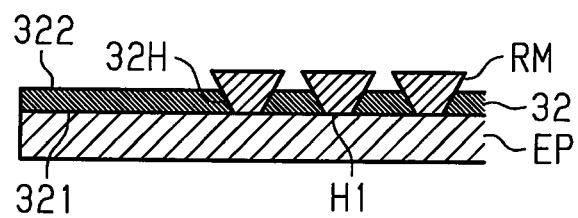
Fig.21D  Resist removal 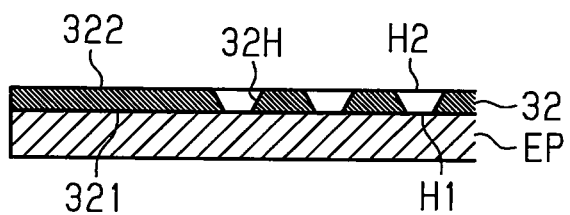
Fig.21E  Joining and peeling 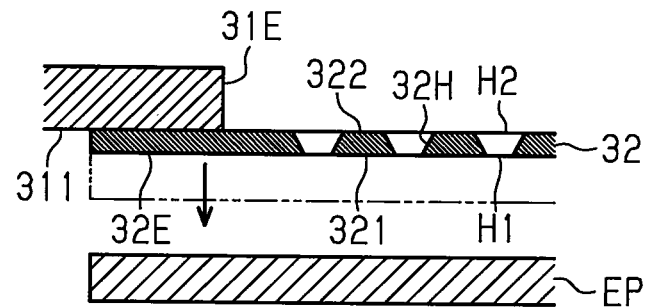

Fig.22A  Resist layer formation 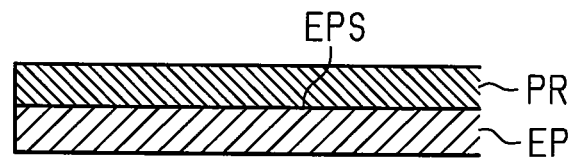
Fig.22B  Resist mask formation 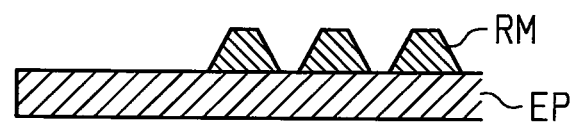
Fig.22C  Electrolysis 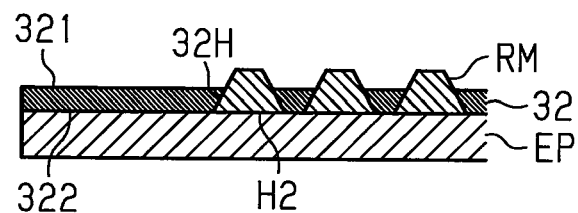
Fig.22D  Resist removal 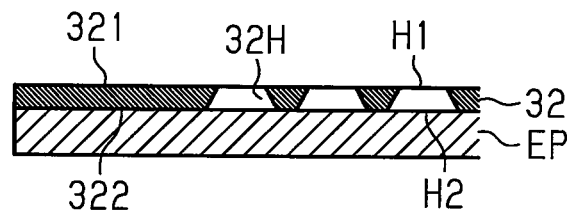
Fig.22E  Peeling 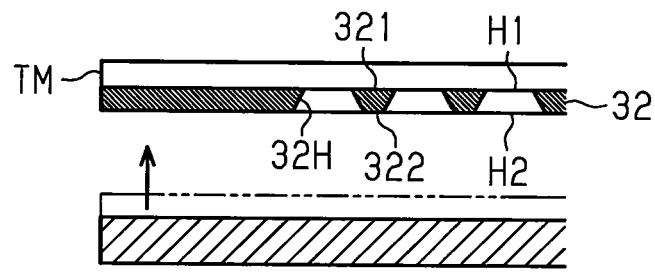
Fig.22F  Joining and peeling 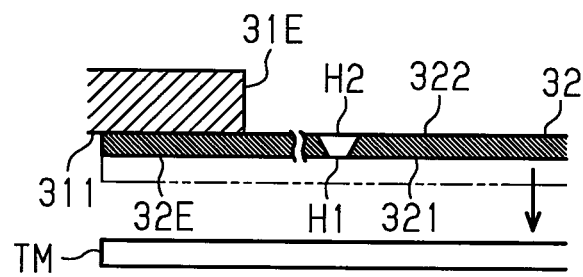

VAPOR DEPOSITION MASK SUBSTRATE, VAPOR DEPOSITION MASK SUBSTRATE MANUFACTURING METHOD, VAPOR DEPOSITION MASK MANUFACTURING METHOD, AND DISPLAY DEVICE MANUFACTURING METHOD

BACKGROUND

The present disclosure relates to a vapor deposition mask substrate, a method for manufacturing a vapor deposition mask substrate, a method for manufacturing a vapor deposition mask, and a method for manufacturing a display device.

A vapor deposition mask includes a first surface, a second surface, and holes extending through the first and second surfaces. The first surface faces a target such as a substrate, and the second surface is opposite to the first surface. The holes each include a first opening, which is located in the first surface, and a second opening, which is located in the second surface. The vapor deposition material entering the holes through the second openings forms on the target a pattern corresponding to the position and shape of the first openings (see Japanese Laid-Open Patent Publication No. 2015-055007, for example).

Each hole of the vapor deposition mask has a cross-sectional area that increases from the first opening toward the second opening. This increases the amount of vapor deposition material entering the hole through the second opening so that an adequate amount of vapor deposition material reaches the first opening. However, at least some of the vapor deposition material entering the hole through the second opening adheres to the wall surface defining the hole, failing to reach the first opening. The vapor deposition material adhering to the wall surface may prevent other vapor deposition material from passing through the hole, lowering the dimensional accuracy of the pattern.

To reduce the volume of vapor deposition material adhering to the wall surfaces, a structure has been contemplated in which the thickness of the vapor deposition mask is reduced to reduce the areas of the wall surfaces. In order to reduce the thickness of the vapor deposition mask, a technique has been contemplated that reduces the thickness of the metal sheet used as the substrate for manufacturing the vapor deposition mask.

However, in the process of etching the metal sheet to form holes, a smaller thickness of the metal sheet results in a smaller volume of metal to be removed. This narrows the permissible ranges in the processing conditions, such as the duration for which etchant is supplied to the metal sheet and the temperature of the supplied etchant. This increases the difficulty in achieving the required dimensional accuracy of the first and second openings. In particular, the manufacturing of metal sheet involves a rolling step, in which the base material is drawn with rolls, or an electrolysis step, in which the metal sheet deposited on an electrode is peeled off from the electrode. Accordingly, the metal sheet has an undulated shape. In the metal sheet having such a shape, the duration for which the ridges in the undulated shape are in contact with the etchant differs greatly from that of the valleys in the undulated shape. This aggravates the reduced accuracy resulting from the narrowed permissible ranges described above. As such, although a thinner vapor deposition mask reduces the amount of vapor deposition material adhering to the wall surfaces and thereby increases the dimensional accuracy of the patterns in repeated vapor deposition, such a vapor deposition mask involves another problem that the required dimensional accuracy of the pattern in each vapor deposition is difficult to achieve.

SUMMARY

It is an objective of the present disclosure to provide a vapor deposition mask substrate, a method for manufacturing a vapor deposition mask substrate, a method for manufacturing a vapor deposition mask, and a method for manufacturing a display device that increase the accuracy of the patterns formed by vapor deposition.

In accordance with one aspect of the present disclosure, a vapor deposition mask substrate is provided, which is a metal sheet that has a shape of a strip and is configured to be etched to include a plurality of holes and used to manufacture a vapor deposition mask. The metal sheet has a longitudinal direction and a width direction. The metal sheet has shapes in the width direction that are taken at different positions in the longitudinal direction of the metal sheet and differ from one another. Each of the shapes is an undulated shape including protrusions and depressions repeating in the width direction of the metal sheet. A length in the width direction of a surface of the metal sheet is a surface distance. A minimum value of surface distances at different positions in the longitudinal direction of the metal sheet is a minimum surface distance. A ratio of a difference between a surface distance and the minimum surface distance to the minimum surface distance is an elongation difference ratio in the width direction. A maximum value of elongation difference ratios is less than or equal to $2\times10^{-5}$.

In another aspect of the present disclosure, a method for manufacturing a vapor deposition mask substrate is provided. The vapor deposition mask substrate is a metal sheet that has a shape of a strip and is configured to be etched to include a plurality of holes and used to manufacture a vapor deposition mask. The method includes obtaining the metal sheet by rolling a base material that satisfies the following conditions. The metal sheet has a longitudinal direction and a width direction. The metal sheet has shapes in the width direction that are taken at different positions in the longitudinal direction of the metal sheet and differ from one another. Each of the shapes is an undulated shape including protrusions and depressions repeating in the width direction of the metal sheet. A length in the width direction of a surface of the metal sheet is a surface distance. A minimum value of surface distances at different positions in the longitudinal direction of the metal sheet is a minimum surface distance. A ratio of a difference between a surface distance and the minimum surface distance to the minimum surface distance is an elongation difference ratio in the width direction. A maximum value of elongation difference ratios is less than or equal to $2\times10^{-3}$.

Further, the present disclosure provides a method for manufacturing a vapor deposition mask. The method includes forming a resist layer on a metal sheet having a shape of a strip and forming a plurality of holes in the metal sheet by etching using the resist layer as a mask to form a mask portion. The metal sheet has a longitudinal direction and a width direction. The metal sheet has shapes in the width direction that are taken at different positions in the longitudinal direction of the metal sheet and differ from one another. Each of the shapes is an undulated shape including protrusions and depressions repeating in the width direction of the metal sheet. A length in the width direction of a surface of the metal sheet is a surface distance. A minimum value of surface distances at different positions in the longitudinal direction of the metal sheet is a minimum surface distance. A ratio of a difference between a surface distance and the minimum surface distance to the minimum surface distance is an elongation difference ratio in the width direction. A maximum value of elongation difference ratios is less than or equal to $2 \times 10^{-3}$.

In accordance with another aspect, a method for manufacturing a display device is provided. The method includes preparing a vapor deposition mask manufactured by the above-described method for manufacturing a vapor deposition mask and forming a pattern by vapor deposition using the vapor deposition mask.

BRIEF DESCRIPTION OF THE DRAWINGS

The features of the present disclosure that are believed to be novel are set forth with particularity in the appended claims. The disclosure, together with objects and advantages thereof, may best be understood by reference to the following description of the presently preferred embodiments together with the accompanying drawings in which:

FIGS. 20A to 20H are process diagrams for illustrating an example of a method for manufacturing a vapor deposition mask.

FIGS. 21A to 21E are process diagrams for illustrating an example of a method for manufacturing a vapor deposition mask.

FIGS. 22A to 22F are process diagrams for illustrating an example of a method for manufacturing a vapor deposition mask.

DESCRIPTION OF EXEMPLARY EMBODIMENTS

Referring to FIGS. 1 to 39, embodiments of a vapor deposition mask substrate, a method for manufacturing a vapor deposition mask substrate, a method for manufacturing a vapor deposition mask, and a method for manufacturing a display device are now described.

[Structure of Vapor Deposition Mask Substrate]

Figure 1:
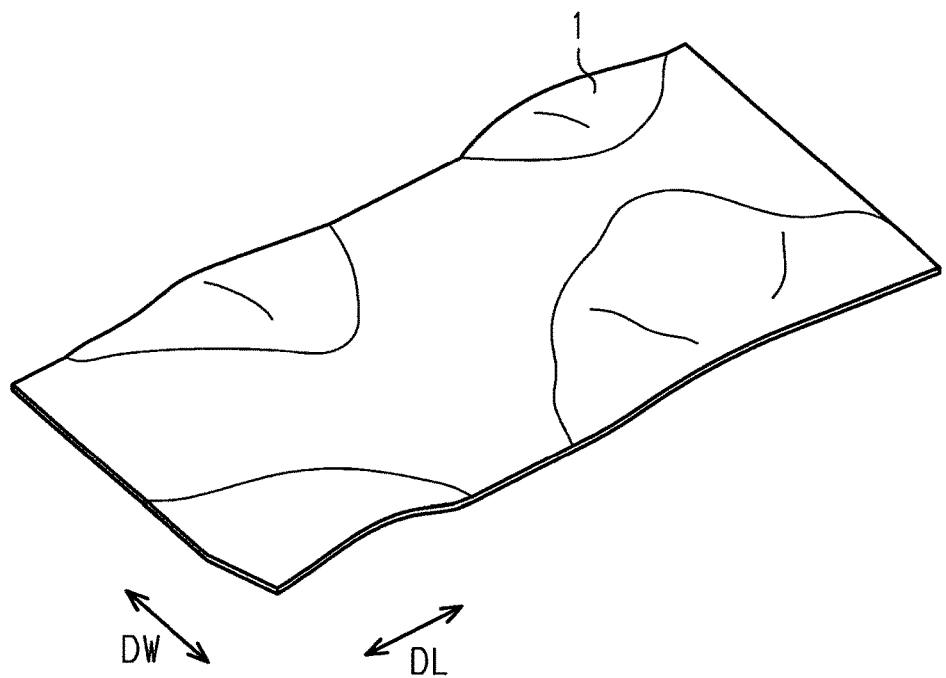
FIG. 1 is a perspective view showing a vapor deposition mask substrate.

As shown in FIG. 1, a vapor deposition mask substrate 1 is a metal sheet having the shape of a strip. The vapor deposition mask substrate 1 has an undulated shape in which undulations are repeated in the width direction DW at each of different positions in the longitudinal direction DL. The undulated shapes at different positions in the longitudinal direction DL of the vapor deposition mask substrate 1 differ from one another. The different undulated shapes differ in characteristics such as the number of undulations (protrusions and depressions), the length of undulation, and the height of undulations in the undulated shapes. For illustrative purposes, the shapes of the vapor deposition mask substrate 1 are exaggerated in FIG. 1. The thickness of the vapor deposition mask substrate 1 is between 10 μm and 50 μm inclusive. The uniformity in thickness of the vapor deposition mask substrate 1 is such that the ratio of the difference between the maximum thickness and the minimum thickness to the average thickness is less than or equal to 5%, for example.

The vapor deposition mask substrate 1 may be made of nickel or a nickel-iron alloy, such as a nickel-iron alloy containing at least 30 mass % of nickel. In particular, the vapor deposition mask substrate 1 may be made of Invar, which is mainly composed of an alloy containing 36 mass % of nickel and 64 mass % of iron. When the main component is the alloy of 36 mass % of nickel and 64 mass % of iron, the remainder contains additives such as chromium, manganese, carbon, and cobalt. When the vapor deposition mask substrate 1 is made of Invar, the vapor deposition mask substrate 1 has a thermal expansion coefficient of about $1.2 \times 10^{-6}/°$ C. The vapor deposition mask substrate 1 having such a thermal expansion coefficient produces a mask that changes its size due to thermal expansion to an extent equivalent to that of a glass substrate and a polyimide sheet. Thus, a glass substrate or a polyimide sheet is suitably used as a vapor deposition target.

[Elongation Difference Ratio]

When the vapor deposition mask substrate 1 is placed on a level surface, the position (height) of the surface of the vapor deposition mask substrate 1 with respect to the level surface is referred to as the surface position.

Figure 2:
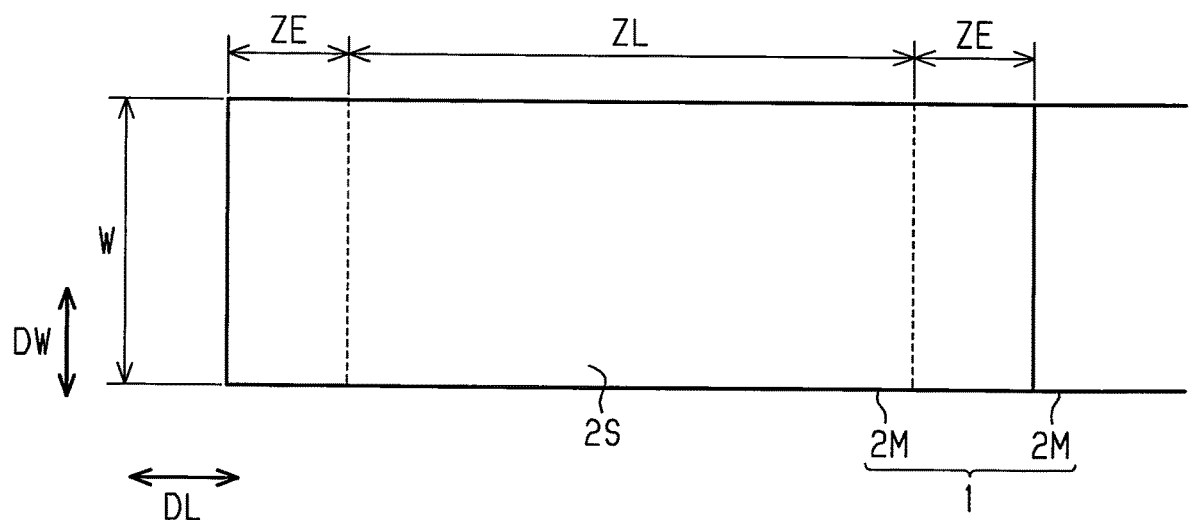
FIG. 2 is a plan view showing a measurement substrate.

Referring to FIG. 2, to measure the surface position, a metal sheet, which is manufactured through rolling or electrolysis, is cut such that the dimension of the metal sheet in the width direction DW is a width W. Then, the vapor deposition mask substrate 1, which is a metal sheet having the shape of a strip, is wound to form a roll. Then, a slitting step is performed in which the vapor deposition mask substrate 1 is cut across in the width direction DW (cut across the width) so that a measurement substrate 2M is cut out as a section of the vapor deposition mask substrate 1 in the longitudinal direction DL. The width W in the width direction DW of the measurement substrate 2M is equal to the dimension in the width direction DW of the vapor deposition mask substrate 1. Then, the surface position of the surface 2S of the measurement substrate 2M is measured at different positions in the width direction DW and at predetermined intervals in the longitudinal direction DL. The area in which the surface position is measured is a measurement area ZL.

The measurement area ZL is an area that excludes the non-measurement areas ZE located at the two edges in the longitudinal direction DL of the measurement substrate 2M. The measurement area ZL also excludes the non-measurement areas (not shown) located at the two edges in the width direction DW of the measurement substrate 2M. The slitting step for cutting the vapor deposition mask substrate 1 may give the measurement substrate a new undulated shape that differs from the undulated shape of the vapor deposition mask substrate 1. The length in the longitudinal direction DL of each non-measurement area ZE corresponds to the area in which such a new undulated shape can be formed, and the non-measurement areas ZE are excluded from the measurement of surface positions. The length in the longitudinal direction DL of each non-measurement area ZE is 100 mm, for example. To exclude the new undulated shape formed in the slitting step at the edges in the width direction DW, each of the non-measurement areas at the edges in the width direction DW has a dimension of 10 mm, for example, in the width direction DW from the edge.

Figure 3:
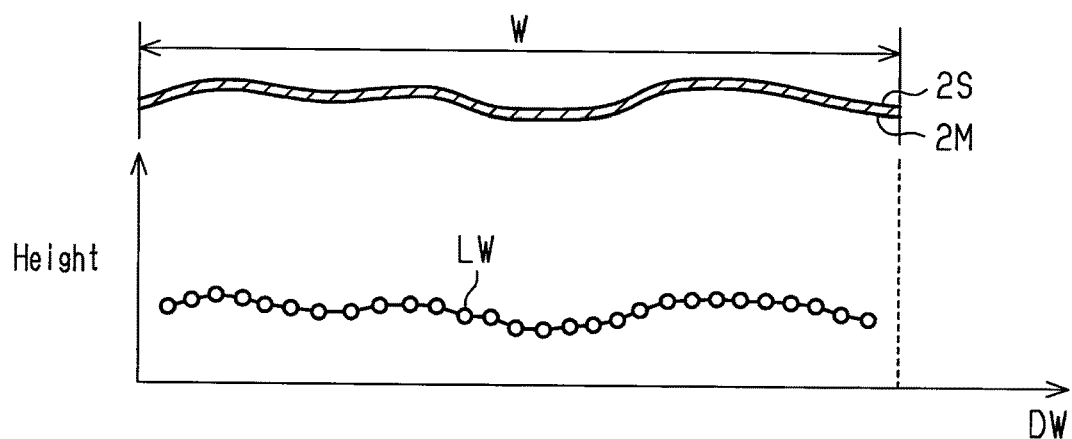
FIG. 3 is a diagram showing a graph for illustrating elongation difference ratios together with the cross-sectional structure of a measurement substrate.

FIG. 3 is a graph showing an example of the surface positions at different positions in the width direction DW of the measurement substrate 2M, together with the cross-sectional structure of a cross-section taken in the width direction DW of the measurement substrate 2M. FIG. 3 shows an example of one of the different sections in the longitudinal direction DL. This section has three undulations in the width direction DW.

As shown in FIG. 3, the different positions in the width direction DW at which heights are measured are set at intervals that enable representation of the undulated shape of protrusions and depressions of the vapor deposition mask substrate 1. The different positions in the width direction DW at which heights are measured are at intervals of between 1 mm and 20 mm inclusive in the width direction DW, for example. The length of the polygonal line LW connecting the heights at different positions in the width direction DW is calculated as a surface distance La. In other words, the surface distance La is the length of the surface of the vapor deposition mask substrate 1 measured in the width direction. An elongation difference ratio in the width direction DW of the vapor deposition mask substrate 1 is defined by Expression 1 below. That is, when the minimum value of the surface distances La at different positions in the longitudinal direction DL of the vapor deposition mask substrate 1 is a minimum surface distance Lm, the ratio of the difference between a surface distance La and the minimum surface distance Lm to the minimum surface distance Lm is the elongation difference ratio.

Elongation Difference Ratio=$(La-Lm)/Lm$   (Expression 1)

Figure 4:
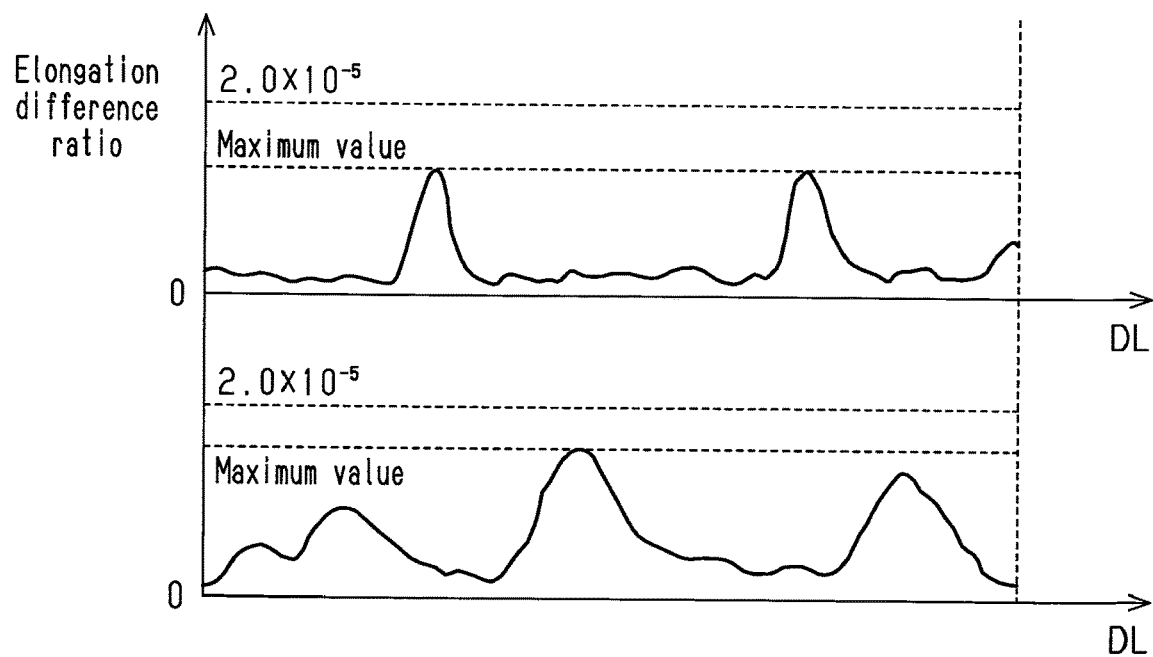
FIG. 4 is a graph for illustrating the distribution in the longitudinal direction of elongation difference ratios in the width direction.

FIG. 4 shows the elongation difference ratios in the width direction DW measured at different positions in the longitudinal direction DL of the vapor deposition mask substrate 1. The upper solid line in FIG. 4 shows an example in which the elongation difference ratios in the width direction DW have two peaks per unit length. The lower solid line in FIG. 4 shows an example in which elongation difference ratios in the width direction DW have four peaks per unit length in the longitudinal direction DL. The unit length is 500 mm in FIG. 4. The peaks of elongation difference ratios have maxima of $0.5 \times 10^{-3}$ or greater.

As shown in FIG. 4, the elongation difference ratios in the width direction DW of the vapor deposition mask substrate 1 include a single or multiple peaks per unit length, for example. Multiple peaks may be spaced apart from one another by specific distances in the longitudinal direction DL. Alternatively, the vapor deposition mask substrate 1 may be free of a peak.

The elongation difference ratios in the width direction DW of the vapor deposition mask substrate 1 satisfy Condition 1 below. The elongation difference ratios in the width direction DW of the vapor deposition mask substrate 1 preferably satisfy at least one of Condition 2 to Condition 4 below.

[Condition 1] The maximum value of elongation difference ratios in the width direction DW is less than or equal to $2 \times 10^{-3}$.

[Condition 2] The average value of elongation difference ratios in the width direction DW per unit length is less than or equal to $0.5 \times 10^{-3}$.

[Condition 3] The number of peaks per unit length is less than or equal to three.

[Condition 4] The distances between peaks per unit length are greater than or equal to 100 mm.

As indicated by the solid lines in FIG. 4, in the example satisfying Condition 1, the maximum value of elongation difference ratios in the width direction DW is less than or equal to $2 \times 10^{-3}$. That is, the maximum value of elongation difference ratios in the width direction DW of the vapor deposition mask substrate 1 is less than or equal to $2 \times 10^{-3}$. Accordingly, the number of the protrusions and depressions repeating in the width direction DW and the surface unevenness in the width direction DW are not excessively large at different positions in the longitudinal direction DL. Thus, when the liquid for processing is supplied to the surface of the vapor deposition mask substrate 1, which is transferred in the longitudinal direction, the liquid will not be stagnated by the unevenness. This facilitates the uniform flow of liquid on the surface of the vapor deposition mask substrate 1 even when the same process is repeated in the longitudinal direction DL. Accordingly, the liquid supplied to the surface of the vapor deposition mask substrate is unlikely to stagnate in a section in the longitudinal direction DL. This increases the uniformity of processing including treatment using a liquid such as etchant in the longitudinal direction DL, that is, the uniformity of the holes in the vapor deposition mask substrate 1 in the longitudinal direction DL. This, in turn, increases the accuracy of the pattern formed by vapor deposition.

Further, in roll-to-roll processing, where the vapor deposition mask substrate 1 is pulled out of a roll and then transferred, the tension that pulls the vapor deposition mask substrate 1 acts in the longitudinal direction DL of the vapor deposition mask substrate 1. The tension acting in the longitudinal direction DL stretches the warpage and depressions in the vapor deposition mask substrate 1 in the longitudinal direction DL. Such tension first acts on the section of the vapor deposition mask substrate 1 that is about to be pulled out of the roll. In this section, a greater elongation difference ratio in the width direction DW increases variation in the degrees of stretching. Each time the roll is rotated, the time when the tension is likely to cause stretching and the time when the tension is unlikely to cause stretching are repeated. This results in problems such as deviations in transfer and creases of the vapor deposition mask substrate 1, which is transferred in the longitudinal direction DL. As such, larger elongation difference ratios in the width direction DW tend to cause deviations in transfer in the roll-to-roll processing. In addition, when attaching another film such as dry film resist to the vapor deposition mask substrate 1, larger elongation difference ratios tend to cause problems such as misalignment and reduced adhesion resulting from creases. The structure satisfying Condition 1 limits deviations in transfer, misalignment, and creases, thereby improving the accuracy of the patterns formed by vapor deposition.

The liquid supplied to the surface of the vapor deposition mask substrate 1 may be developing solution for developing the resist layer on the surface of the vapor deposition mask substrate 1 and cleaning solution for removing the developing solution from the surface. The liquid supplied to the surface of the vapor deposition mask substrate 1 may also be etchant for etching the vapor deposition mask substrate 1 and cleaning solution for removing the etchant from the surface. Further, the liquid supplied to the surface of the vapor deposition mask substrate 1 may be stripping solution for stripping the resist layer remaining on the surface of the vapor deposition mask substrate 1 after etching, and cleaning solution for removing the stripping solution from the surface.

The structure described above, in which the flow of liquid supplied to the surface of the vapor deposition mask substrate 1 is unlikely to stagnate in the longitudinal direction DL, increases the uniformity of the processing using liquid on the surface of the vapor deposition mask substrate 1. In addition, the structure in which the average value of elongation difference ratios in the width direction DW satisfies Condition 2 limits the elongation difference ratios in the width direction DW over the entire length in the longitudinal direction DL, further increasing the accuracy of the patterns. Moreover, this structure improves the adhesion between the vapor deposition mask substrate 1, which is transferred in the longitudinal direction DL, and the resist layer, such as dry film, and the accuracy of exposure to the resist layer. That is, the structure that satisfies Conditions 1 and 2 improves the accuracy of exposure, in addition to limiting stagnation of the liquid flow in the longitudinal direction DL. This further improves the uniformity of processing.

The section corresponding to a peak having an elongation difference ratio of $0.5 \times 10^{-5}$ or greater is a section in which the elongation difference ratio increases abruptly as compared to that in the surrounding area. That is, this section has a greater warpage in the width direction DW than other areas. In this respect, the structure in which the number of peaks per unit length satisfies Condition 3 limits stagnation of liquid between the peaks (between the ridges of undulations) of the vapor deposition mask substrate 1, which is transferred in the longitudinal direction DL. Further, the structure in which the distances between peaks per unit length satisfy Condition 4 limits stagnation of liquid between peaks, which would otherwise occur if the distances between peaks are narrow.

As such, the structures satisfying Conditions 1 to 4 and the advantages of these structures are achievable only by identifying the problem in surface processing using liquid that occurs in the vapor deposition mask substrate 1 transferred in the longitudinal direction DL, as well as the problem associated with the effect of the tension acting in the longitudinal direction DL.

[Structure of Mask Device]

Figure 5:
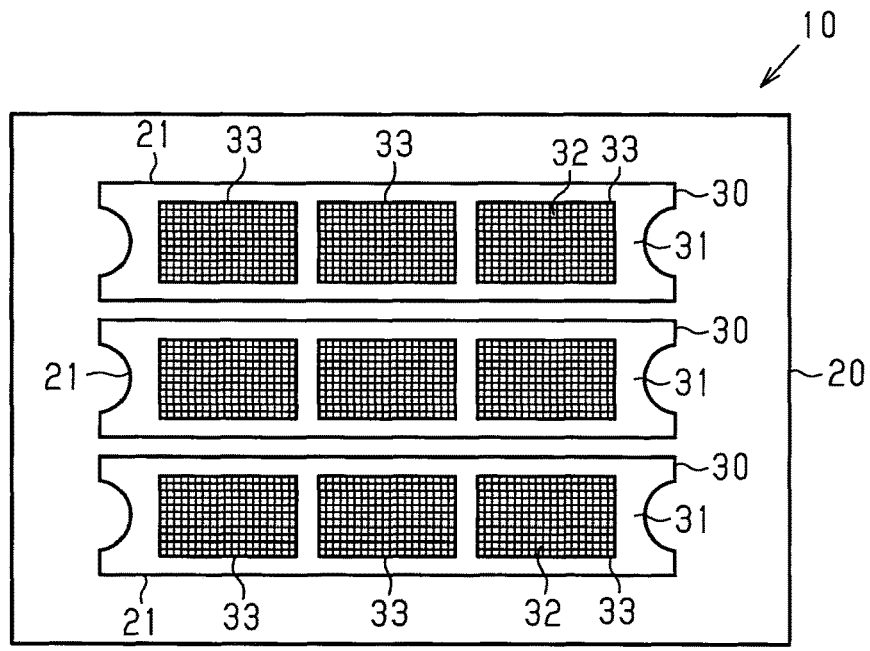
FIG. 5 is a plan view showing the planar structure of a mask device.
Figure 6:
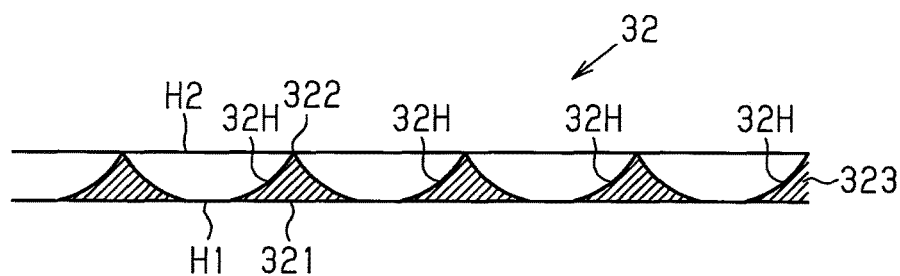
FIG. 6 is a partial cross-sectional view showing an example of the cross-sectional structure of a mask portion.
Figure 7:
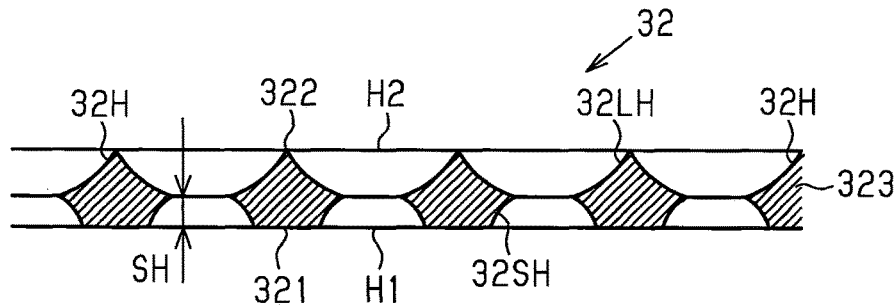
FIG. 7 is a partial cross-sectional view showing another example of the cross-sectional structure of a mask portion.

FIG. 5 schematically shows the planar structure of a mask device including a vapor deposition mask manufactured using the vapor deposition mask substrate 1. FIG. 6 shows an example of the cross-sectional structure of a mask portion of a vapor deposition mask. FIG. 7 shows another example of the cross-sectional structure of a mask portion of a vapor deposition mask. The number of the vapor deposition masks in the mask device and the number of mask portions in a vapor deposition mask 30 shown are by way of example.

As shown in FIG. 5, a mask device 10 includes a main frame 20 and three vapor deposition masks 30. The main frame 20 has the shape of a rectangular frame and supports the vapor deposition masks 30. The main frame 20 is attached to a vapor deposition apparatus that performs vapor deposition. The main frame 20 includes main frame holes 21, which extend through the main frame 20 and extend substantially over the entire areas in which the vapor deposition masks 30 are placed.

The vapor deposition masks 30 include a plurality of frame portions 31, each having the shape of a planar strip, and three mask portions 32 in each frame portion 31. Each frame portion 31, which supports mask portions 32 and has the shape of a planar strip, is attached to the main frame 20. Each frame portion 31 includes frame holes 33, which extend through the frame portion 31 and extend substantially over the entire areas in which mask portions 32 are placed. The frame portion 31 has a higher rigidity than the mask portions 32 and is shaped as a frame surrounding the frame holes 33. The mask portions 32 are separately fixed by welding or adhesion to the frame inner edge sections of the frame portion 31 defining the frame holes 33.

As shown in FIG. 6, an example of a mask portion 32 is made of a mask plate 323. The mask plate 323 may be a single planar member made of a vapor deposition mask substrate 1 or a laminate of a single planar member made of a vapor deposition mask substrate 1 and a plastic sheet. FIG. 6 shows a single planar member made of the vapor deposition mask substrate 1.

The mask plate 323 includes a first surface 321 (the lower surface in FIG. 6) and a second surface 322 (the upper surface in FIG. 6), which is opposite to the first surface 321. The first surface 321 faces the vapor deposition target, such as a glass substrate, when the mask device 10 is attached to a vapor deposition apparatus. The second surface 322 faces the vapor deposition source of the vapor deposition apparatus. The mask portion 32 includes a plurality of holes 32H extending through the mask plate 323. The wall surface defining each hole 32H is inclined with respect to the thickness direction of the mask plate 323 in a cross-sectional view. In a cross-sectional view, the wall surface defining each hole 32H may have a semicircular shape protruding outward of the hole 32H as shown in FIG. 6, or a complex curved shape having a plurality of bend points.

The mask plate 323 has a thickness of between 1 μm and 50 μm inclusive, preferably between 2 μm and 20 μm inclusive. The thickness of the mask plate 323 that is less than or equal to 50 μm allows the holes 32H formed in the mask plate 323 to have a depth of less than or equal to 50 μm. This thin mask plate 323 allows the wall surfaces defining the holes 32H to have small areas, thereby reducing the volume of vapor deposition material adhering to the wall surfaces defining the holes 32H.

The second surface 322 includes second openings H2, which are openings of the holes 32H. The first surface 321 includes first openings H1, which are openings of the holes 32H. The second openings H2 are larger than the first openings H1 in a plan view. Each mask hole 32H is a passage for the vapor deposition particles sublimated from the vapor deposition source. The vapor deposition material sublimated from the vapor deposition source moves from the second openings H2 to the first openings H1. The second openings H2 that are larger than the first openings H1 increase the amount of vapor deposition material entering the holes 32H through the second openings H2. The area of each hole 32H in a cross-section taken along the first surface 321 may increase monotonically from the first opening H1 toward the second opening H2, or may be substantially uniform in a section between the first opening H1 and the second opening H2.

As shown in FIG. 7, another example of a mask portion 32 includes a plurality of holes 32H extending through the mask plate 323. The second openings H2 are larger than the first openings H1 in a plan view. Each hole 32H consists of a large hole 32LH, which includes a second opening H2, and a small hole 32SH, which includes a first opening H1. The large hole 32LH has a cross-sectional area that monotonically decreases from the second opening H2 toward the first surface 321. The small hole 32SH has a cross-sectional area that monotonically decreases from the first opening H1 toward the second surface 322. The section of the wall surface defining each hole 32H where the large hole 32LH meets the small hole 32SH at a middle section in the thickness direction of the mask plate 323 projects inward of the hole 32H. The distance between the first surface 321 and the protruding section of the wall surface defining the hole 32H is a step height SH. The example of cross-sectional structure shown in FIG. 6 has zero step height SH. To increase the amount of vapor deposition material reaching the first openings H1, the step height SH is preferably zero. In order for a mask portion 32 to have zero step height SH, the mask plate 323 should be thin enough so that wet etching from only one side of the vapor deposition mask substrate 1 achieves formation of holes 32H. For example, the mask plate 323 may have a thickness of less than or equal to 50 μm.

[Mask Portion Joining Structure]

Figure 8:
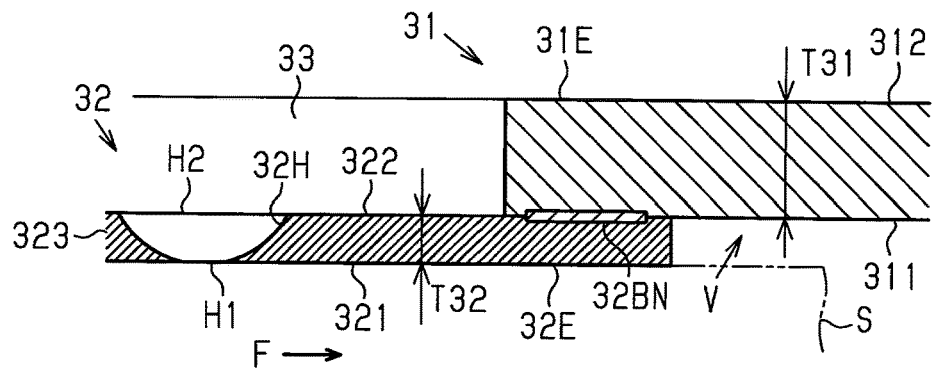
FIG. 8 is a partial cross-sectional view showing an example of the structure of joining between an edge of a mask portion and a frame portion.
Figure 9:
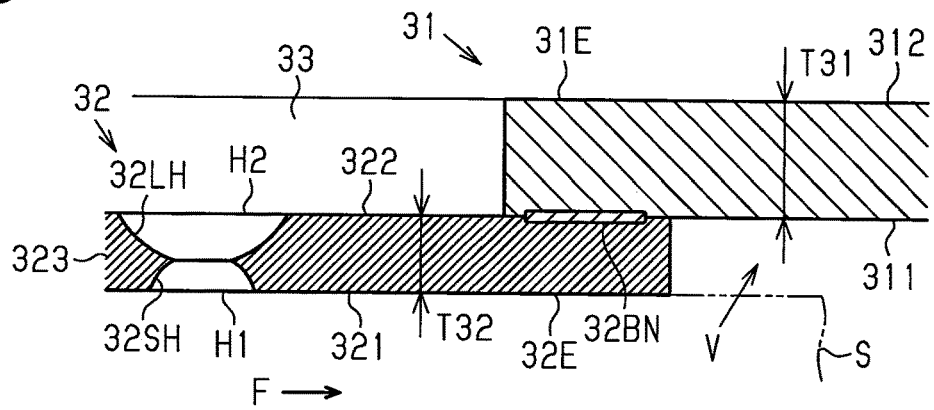
FIG. 9 is a partial cross-sectional view showing another example of the structure of joining between an edge of a mask portion and a frame portion.

FIG. 8 shows an example of the cross-sectional structure of joining between a mask portion 32 and a frame portion 31. FIG. 9 shows another example of the cross-sectional structure of joining between a mask portion 32 and a frame portion 31.

In the example shown in FIG. 8, the outer edge section 32E of a mask plate 323 is a region that is free of holes 32H. The part of the second surface 322 of the mask plate 323 included in the outer edge section 32E of the mask plate 323 is an example of a side surface of the mask portion and joined to the frame portion 31. The frame portion 31 includes inner edge sections 31E defining frame holes 33. Each inner edge section 31E includes a joining surface 311 (the lower surface in FIG. 8), which faces the mask plate 323, and a non-joining surface 312 (the upper surface in FIG. 8), which is opposite to the joining surface 311. The thickness T31 of the inner edge section 31E, that is, the distance between the joining surface 311 and the non-joining surface 312 is sufficiently larger than the thickness T32 of the mask plate 323, allowing the frame portion 31 to have a higher rigidity than the mask plate 323. In particular, the frame portion 31 has a high rigidity that limits sagging of the inner edge section 31E by its own weight and displacement of the inner edge section 31E toward the mask portion 32. The joining surface 311 of the inner edge section 31E includes a joining section 32BN, which is joined to the second surface 322.

The joining section 32BN extends continuously or intermittently along substantially the entire circumference of the inner edge section 31E. The joining section 32BN may be a welding mark formed by welding the joining surface 311 to the second surface 322, or a joining layer joining the joining surface 311 to the second surface 322. When the joining surface 311 of the inner edge section 31E is joined to the second surface 322 of the mask plate 323, the frame portion 31 applies stress F to the mask plate 323 that pulls the mask plate 323 outward.

The main frame 20 also applies stress to the frame portion 31 that pulls the frame portion 31 outward. This stress corresponds to the stress F applied to the mask plate 323. Accordingly, the vapor deposition mask 30 removed from the main frame 20 is released from the stress caused by the joining between the main frame 20 and the frame portion 31, and the stress F applied to the mask plate 323 is relaxed. The position of the joining section 32BN in the joining surface 311 is preferably set such that the stress F isotropically acts on the mask plate 323. Such a position may be selected according to the shape of the mask plate 323 and the shape of the frame holes 33.

The joining surface 311 is a plane including the joining section 32BN and extends outward of the mask plate 323 from the outer edge section 32E of the second surface 322. In other words, the inner edge section 31E has a planar structure that virtually extends the second surface 322 outward, so that the inner edge section 31E extends from the outer edge section 32E of the second surface 322 toward the outside of the mask plate 323. Accordingly, in the area in which the joining surface 311 extends, a space V, which corresponds to the thickness of the mask plate 323, is likely to form around the mask plate 323. This limits physical interference between the vapor deposition target S and the frame portion 31 around the mask plate 323.

In the vapor deposition mask 30, the side surfaces of the mask portions 32 are joined to the single frame portion 331. This increases the shape uniformity of the mask portions 32 in the vapor deposition mask 30 having a plurality of mask portions 32.

FIG. 9 shows another example in which the outer edge section 32E of the second surface 322 includes a region that is free of holes 32H. The outer edge section 32E of the second surface 322 includes a joining section 32BN with which the outer edge section 32E is joined to the joining surface 311 of the frame portion 31. The frame portion 31 applies stress F to the mask plate 323 that pulls the mask plate 323 outward. The frame portion 31 also creates a space V, which corresponds to the thickness of the mask plate 323, in the area where the joining surface 311 extends.

The mask plate 323 that is not subjected to the stress F may have some undulations in a similar manner as the vapor deposition mask substrate 1. The mask plate 323 that is subjected to the stress F, that is, the mask plate 323 mounted to the vapor deposition mask 30, may deform such that the heights of the undulations are reduced. However, any deformation caused by the stress F does not exceed the permissible degree when the vapor deposition mask substrate 1 satisfies the conditions described above. Accordingly, the holes 32H in the vapor deposition mask 30 are less likely to deform, improving the accuracy of the position and shape of the patterns.

[Quantity of Mask Portions]

Figure 10A:
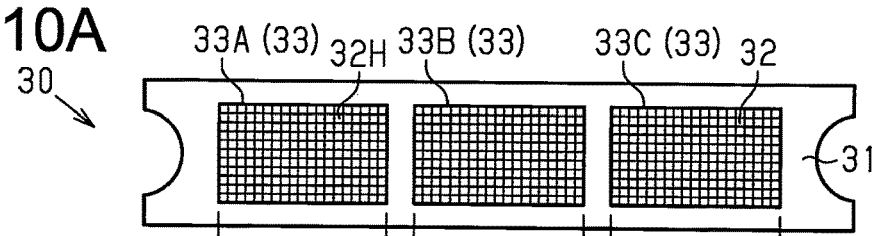
FIG. 10A is a plan view showing an example of the planar structure of a vapor deposition mask.
Figure 10B:
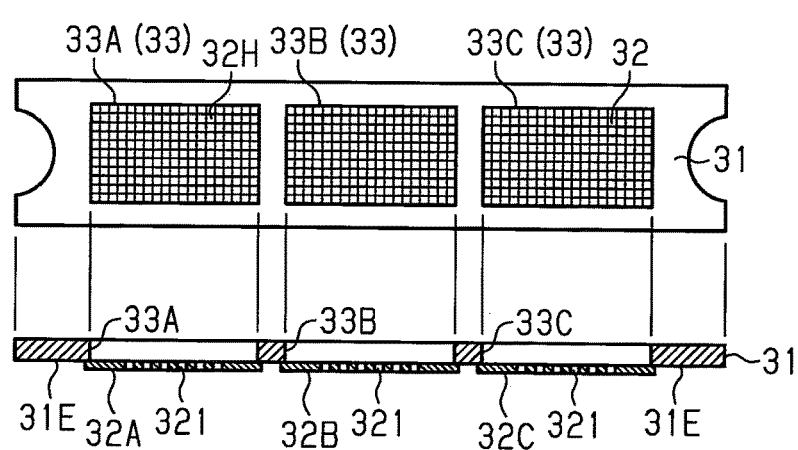
FIG. 10B is a cross-sectional view showing an example of the cross-sectional structure of the vapor deposition mask.
Figure 11A:
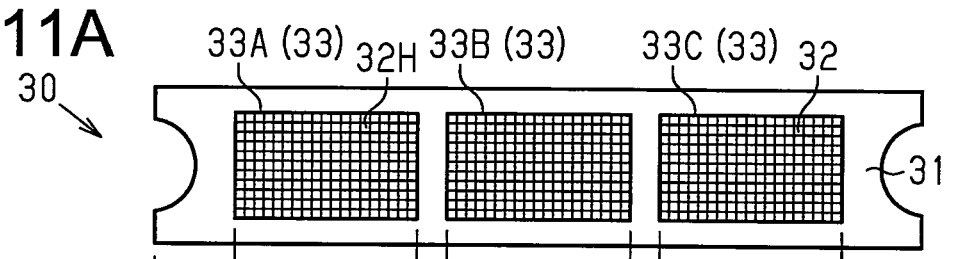
FIG. 11A is a plan view showing another example of the planar structure of a vapor deposition mask.
Figure 11B:
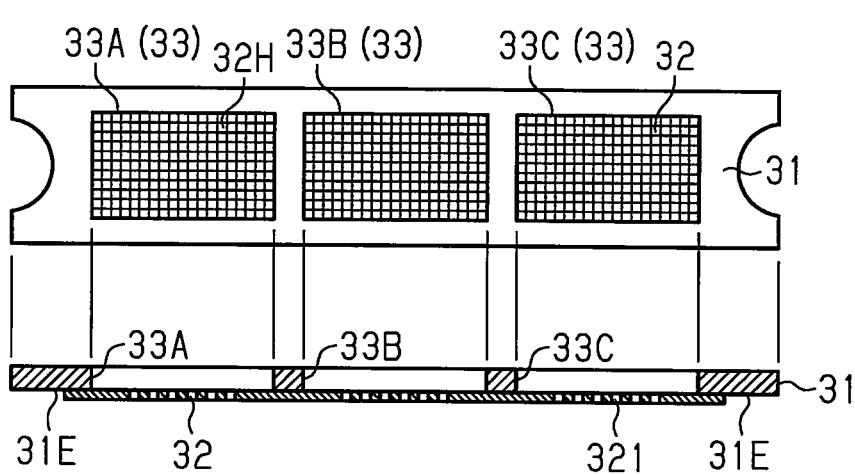
FIG. 11B is a cross-sectional view showing another example of the cross-sectional structure of the vapor deposition mask.

FIGS. 10A and 10B show an example of the relationship between the quantity of holes 32H in a vapor deposition mask 30 and the quantity of holes 32H in a mask portion 32. FIGS. 11A and 11B show another example of the relationship between the quantity of holes 32H in a vapor deposition mask 30 and the quantity of holes 32H in a mask portion 32.

FIG. 10A shows an example in which the frame portion 31 includes three frame holes 33 (33A, 33B, and 33C). As shown in FIG. 10B, the vapor deposition mask 30 of this example includes one mask portion 32 (32A, 32B, or 32C) in each of the frame holes 33. The inner edge section 31E defining the frame hole 33A is joined to a mask portion 32A, the inner edge section 31E defining the frame hole 33B is joined to another mask portion 32B, and the inner edge section 31E defining the frame hole 33C is joined to the other mask portion 32C.

The vapor deposition mask 30 is used repeatedly for a plurality of vapor deposition targets. Thus, the position and structure of the holes 32H in the vapor deposition mask 30 need to be highly accurate. When the position and structure of the holes 32H fail to have the desired accuracy, the mask portions 32 may require replacement when manufacturing or repairing the vapor deposition mask 30.

When only one of the mask portions 32 needs to be replaced, for example, the structure in which the quantity of holes 32H required in one frame portion 31 is divided into three mask portions 32 as shown in FIGS. 10A and 10B only requires the replacement of one of the three mask portions 32. In other words, the two of the three mask portions 32 continue to be used. Thus, the structure in which the mask portions 32 are separately joined to the respective frame holes 33 reduces the consumption of various materials associated with the manufacturing and repair of the vapor deposition mask 30. In addition, a thinner mask plate 323 and smaller holes 32H tend to reduce the yield of the mask portion 32 and increase the need for replacement of the mask portion 32. Thus, the structure in which each frame hole 33 has one mask portion 32 is particularly suitable for a vapor deposition mask 30 that requires high resolution.

The position and structure of the holes 32H are preferably determined while the stress F is applied, that is, while the mask portions 32 are joined to the frame portion 31. In this respect, the joining section 32BN preferably extends partly and intermittently along the inner edge section 31E so that the mask portion 32 is replaceable.

FIG. 11A shows an example in which the frame portion 31 includes three frame holes 33 (33A, 33B, and 33C). As shown in the example of FIG. 11B, the vapor deposition mask 30 may include one mask portion 32, which is common to the frame holes 33. The inner edge section 31E defining the frame hole 33A, the inner edge section 31E defining the frame hole 33B, and the inner edge section 31E defining the frame hole 33C are joined to the common mask portion 32.

The structure in which the quantity of the holes 32H required in one frame portion 31 is assigned to a single mask portion 32 involves only one mask portion 32 joined to the frame portion 31. This reduces the load required for joining between the frame portion 31 and the mask portion 32. In addition, a thicker mask plate 323 forming the mask portion 32 and larger holes 32H tend to increase the yield of the mask portion 32 and reduce the need for replacement of the mask portion 32. Thus, the structure in which the frame holes 33 shares the common mask portion 32 is particularly suitable for a vapor deposition mask 30 that requires low resolution.

[Method for Manufacturing Vapor Deposition Mask Substrate]

Figure 12:
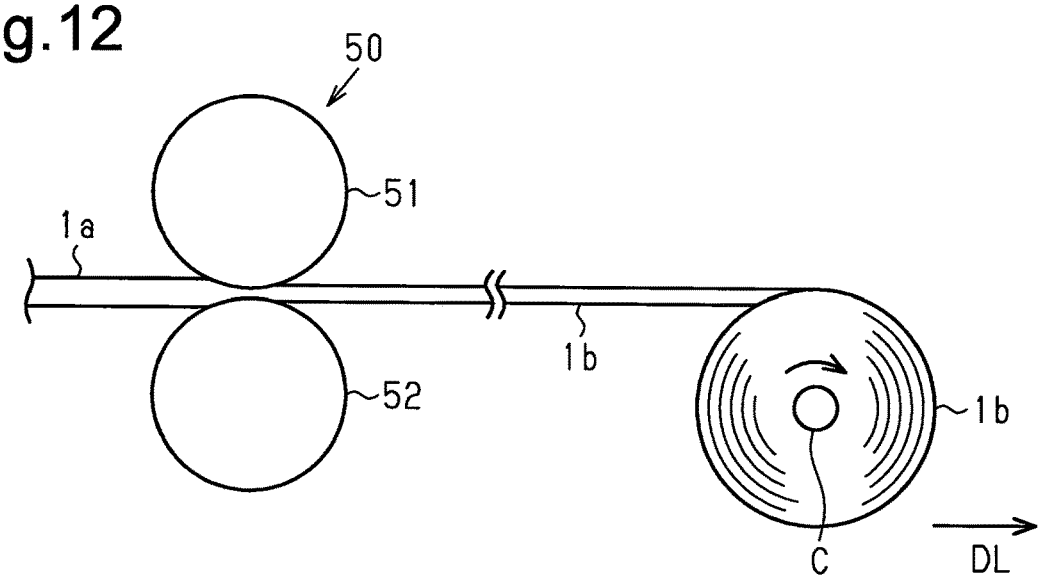
FIG. 12 is a process diagram showing a rolling step for manufacturing a vapor deposition mask substrate.
Figure 13:
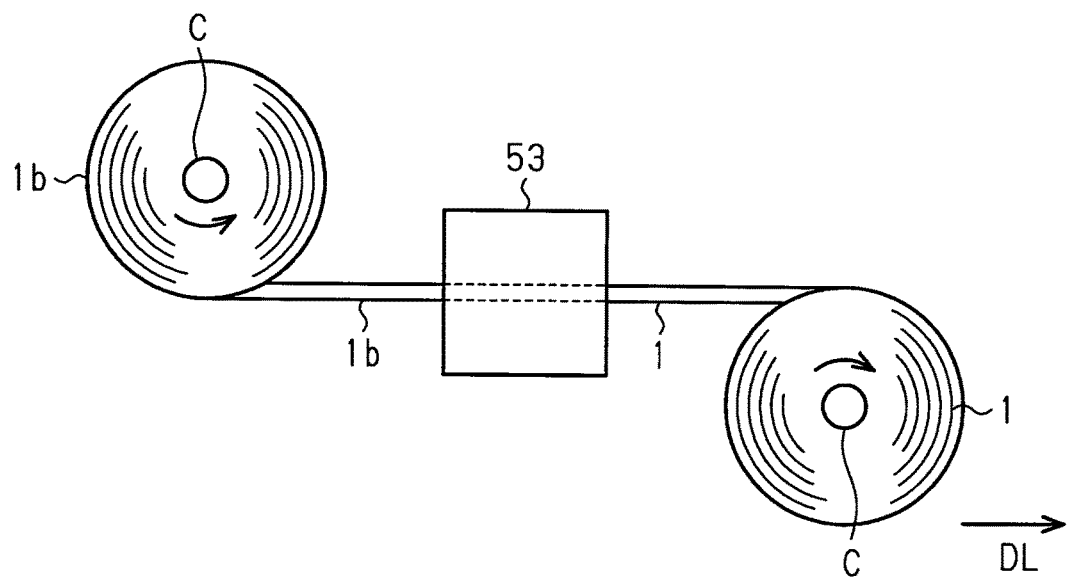
FIG. 13 is a process diagram showing a heating step for manufacturing a vapor deposition mask substrate.

Methods for manufacturing the vapor deposition mask substrate are now described. As methods for manufacturing a vapor deposition mask substrate, a method using rolling and a method using electrolysis are described separately. The method using rolling is first described, followed by the method using electrolysis. FIGS. 12 and 13 show an example using rolling.

Referring to FIG. 12, the method using rolling first prepares a base material 1a made of Invar, for example. The base material 1a extends in the longitudinal direction DL. Then, the base material 1a is transferred toward a rolling mill 50 such that the longitudinal direction DL of the base material 1a is parallel to the direction in which the base material 1a is transferred. The rolling mill 50 may include a pair of rolls 51 and 52, which rolls the base material 1a. This stretches the base material 1a in the longitudinal direction DL, forming a rolled material 1b. The rolled material 1b is cut so as to have a width W in the width direction DW. The rolled material 1b may be wound around a core C or handled in a state of being extended in the shape of a strip. The rolled material 1b has a thickness of between 10 μm and 50 μm inclusive, for example. FIG. 12 shows an example in which a single pair of rolls is used, but a plurality of pairs of rolls may be used.

As shown in FIG. 13, the rolled material 1b is then transferred to an annealing apparatus 53. The annealing apparatus 53 heats the rolled material 1b that is being stretched in the longitudinal direction DL. This removes the residual stress remaining in the rolled material 1b and forms the vapor deposition mask substrate 1. The pressing force between the rolls 51 and 52, the rotation speed of the rolls 51 and 52, and the annealing temperature of the rolled material 1b are set to satisfy Condition 1. Preferably, parameters such as the pressing force between the rolls 51 and 52, the rotation speed of the rolls 51 and 52, the pressing temperature of the rolls 51 and 52, and the annealing temperature of the rolled material 1b are set to satisfy at least one of Conditions 2 to 4, in addition to Condition 1. The rolled material 1b may be cut after the annealing process so as to have the width W in the width direction DW.

In the method using electrolysis, the vapor deposition mask substrate 1 is formed on the surface of the electrode for electrolysis and then removed from the surface. This may use an electrolytic drum electrode, which has a mirror-finished surface and is immersed in the electrolytic bath, and another electrode, which supports the electrolytic drum electrode from the lower side and faces the surface of the electrolytic drum electrode. An electric current flows between the electrolytic drum electrode and the other electrode, and the vapor deposition mask substrate 1 is deposited on the electrode surface, which is the surface of the electrolytic drum electrode. When the vapor deposition mask substrate 1 on the rotating electrolysis drum electrode obtains the desired thickness, the vapor deposition mask substrate 1 is peeled off from the surface of the electrolysis drum electrode and wound into a roll.

When the vapor deposition mask substrate 1 is made of Invar, the electrolytic bath for electrolysis contains an iron ion source, a nickel ion source, and a pH buffer, for example. The electrolytic bath used for electrolysis may also contain a stress relief agent, an $Fe^{3+}$ ion masking agent, and a complexing agent, such as malic acid and citric acid, and is a weakly acidic solution having a pH adjusted for electrolysis. Examples of the iron ion source include ferrous sulfate heptahydrate, ferrous chloride, and ferrous sulfamate. Examples of the nickel ion source include nickel (II) sulfate, nickel (II) chloride, nickel sulfamate, and nickel bromide. Examples of the pH buffer include boric acid and malonic acid. Malonic acid also functions as an $Fe^{3+}$ ion masking agent. The stress relief agent may be saccharin sodium, for example. The electrolytic bath used for electrolysis may be an aqueous solution containing additives listed above and is adjusted using a pH adjusting agent, such as 5% sulfuric acid or nickel carbonate, to have a pH of between 2 and 3 inclusive, for example. If necessary, an annealing step may be included.

As the conditions for electrolysis, the temperature of the electrolytic bath, current density, and electrolysis time are adjusted according to the properties of the vapor deposition mask substrate 1, such as the thickness and composition ratio. The anode used in the electrolytic bath may be made of pure iron and nickel. The cathode used in the electrolytic bath may be a plate of stainless steel such as SUS304. The temperature of the electrolytic bath may be between 40° C. and 60° C. inclusive. The current density may be between 1 $A/dm^2$ and 4 $A/dm^2$ inclusive. The current density on the surface of the electrode is set to satisfy Condition 1. Preferably, the current density at the surface of the electrode is set to satisfy at least one of Conditions 2 to 4, in addition to Condition 1.

The vapor deposition mask substrate 1 produced by electrolysis and the vapor deposition mask substrate 1 produced by rolling may be further thinned by chemical or electrical polishing. The polishing solution used for chemical polishing may be a chemical polishing solution for an iron-based alloy that contains hydrogen peroxide as the main component. The electrolyte used for electrical polishing is a perchloric acid based electropolishing solution or a sulfuric acid based electropolishing solution. Since the conditions described above are satisfied, the surface of the vapor deposition mask substrate 1 has limited variation in the result of polishing using the polishing solution and the result of cleaning of the polishing solution using a cleaning solution.

[Method for Manufacturing Mask Portion]

Referring to FIGS. 14 to 19, a process for manufacturing the mask portion 32 shown in FIG. 7 is now described. The process for manufacturing the mask portion 32 shown in FIG. 6 is the same as the process for manufacturing the mask portion 32 shown in FIG. 7 except that the small holes 32SH are formed as through-holes and the step of forming large holes 32LH is omitted. The overlapping steps are not described.

Figure 14:
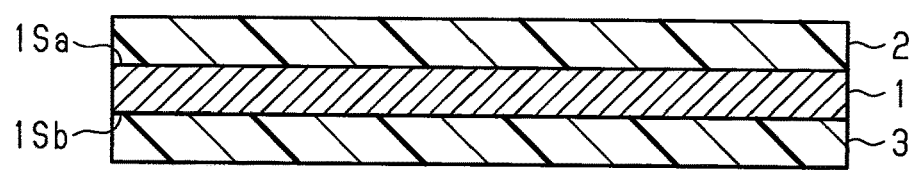
FIGS. 14 to 19 are process diagrams showing an etching step for manufacturing a mask portion.

Referring to FIG. 14, manufacturing of a mask portion starts with preparation of a vapor deposition mask substrate 1 including a first surface 1Sa and a second surface 1Sb, a first dry film resist 2 (a first DFR 2) to be affixed to the first surface 1Sa, and a second dry film resist 3 (a second DFR 3) to be affixed to the second surface 1Sb. The DFRs 2 and 3 are formed separately from the vapor deposition mask substrate 1. Then, the first DFR 2 is affixed to the first surface 1Sa, and the second DFR 3 is affixed to the second surface 1Sb. Since the conditions described above are satisfied, the affixation between the vapor deposition mask substrate 1, which is transferred in the longitudinal direction DL, and the DFRs 2 and 3, which are transferred along the vapor deposition mask substrate 1, is less likely to cause deviations in transfer, misalignment, or creases.

Figure 15:
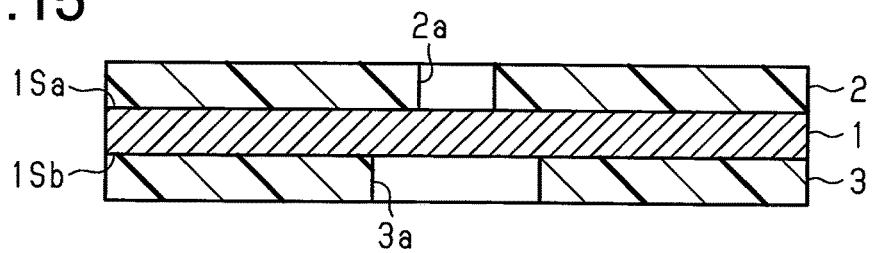

Referring to FIG. 15, the sections of the DFRs 2 and 3 other than the sections in which holes are to be formed are exposed to light, and then the DFRs are developed. This forms first through-holes 2a in the first DFR 2 and second through-holes 3a in the second DFR 3. The development of the exposed DFRs uses sodium carbonate solution, for example, as the developing solution. Since the conditions described above are satisfied, the surface of the vapor deposition mask substrate 1 has limited variation in the result of development using the developing solution and the result of cleaning using a cleaning solution. In addition, the process of affixing is unlikely to cause deviations in transfer, misalignment, or creases, thereby limiting associated displacement of the exposure position and increasing the exposure accuracy. This increases the uniformity of the shape and size of the first and second through-holes 2a and 3a in the surface of the vapor deposition mask substrate 1.

Figure 16:
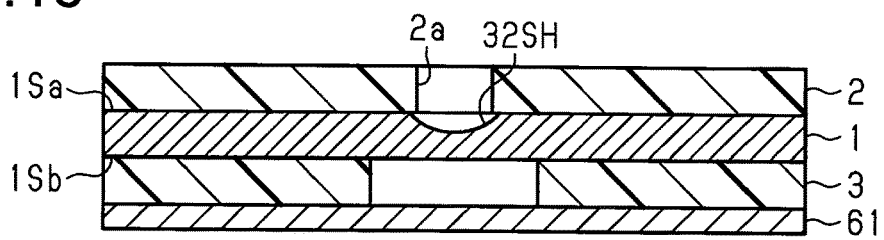

As shown in FIG. 16, the first surface 1Sa of the vapor deposition mask substrate 1 may be etched with ferric chloride solution using the developed first DFR 2 as the mask. Here, a second protection layer 61 is formed over the second surface 1Sb so that the second surface 1Sb is not etched together with the first surface 1Sa. The second protection layer 61 may be made of any material that chemically resists the ferric chloride solution. Small holes 32SH extending toward the second surface 1Sb are thus formed in the first surface 1Sa. Each small hole 32SH includes a first opening H1, which opens in the first surface 1Sa. Since the conditions described above are satisfied, the surface of the vapor deposition mask substrate 1 has limited variation in the result of etching using an etchant and the result of cleaning using a cleaning solution. This increases the uniformity of the shape and size of the small holes 32SH in the surface of the vapor deposition mask substrate 1.

The etchant for etching the vapor deposition mask substrate 1 may be an acidic etchant. When the vapor deposition mask substrate 1 is made of Invar, any etchant that is capable of etching Invar may be used. The acidic etchant may be a solution containing perchloric acid, hydrochloric acid, sulfuric acid, formic acid, or acetic acid mixed in a ferric perchlorate solution or a mixture of a ferric perchlorate solution and a ferric chloride solution. The vapor deposition mask substrate 1 may be etched by a dipping method that immerses the vapor deposition mask substrate 1 in an acidic etchant, or by a spraying method that sprays an acidic etchant onto the vapor deposition mask substrate 1.

Figure 17:
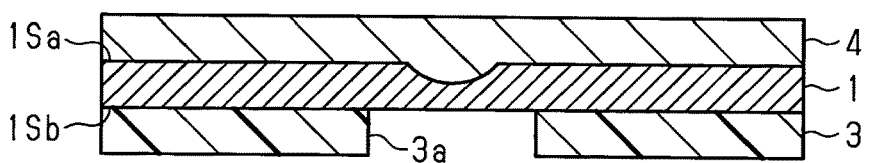

Referring to FIG. 17, the first DFR 2 formed on the first surface 1Sa and the second protection layer 61 on the second DFR 3 are removed. In addition, a first protection layer 4 is formed on the first surface 1Sa to prevent additional etching of the first surface 1Sa. The first protection layer 4 may be made of any material that chemically resists the ferric chloride solution.

Figure 18:
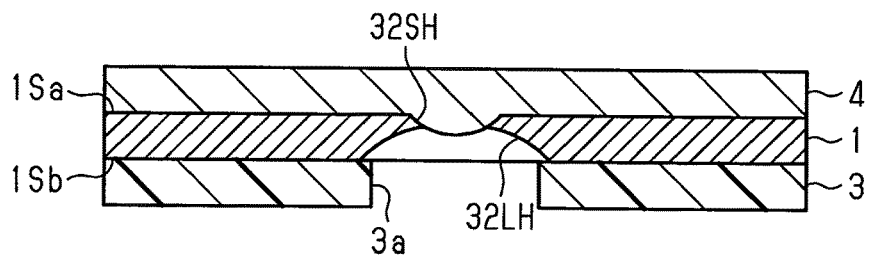

Then, as shown in FIG. 18, the second surface 1Sb is etched with ferric chloride solution using the developed second DFR 3 as the mask. Large holes 32LH extending toward the first surface 1Sa are thus formed in the second surface 1Sb. Each large hole 32LH has a second opening H2, which opens in the second surface 1Sb. The second openings H2 are larger than the first openings H1 in a plan view of the second surface 1Sb. Since the conditions described above are satisfied, the surface of the vapor deposition mask substrate 1 has limited variation in the result of etching using an etchant and the result of cleaning of the etchant using a cleaning solution. This increases the uniformity of the shape and size of the large holes 32LH in the surface of the vapor deposition mask substrate 1. The etchant used in this step may also be an acidic etchant. When the vapor deposition mask substrate 1 is made of Invar, any etchant that is capable of etching Invar may be used. The vapor deposition mask substrate 1 may also be etched by a dipping method that immerses the vapor deposition mask substrate 1 in an acidic etchant, or by a spraying method that sprays an acidic etchant onto the vapor deposition mask substrate 1.

Figure 19:
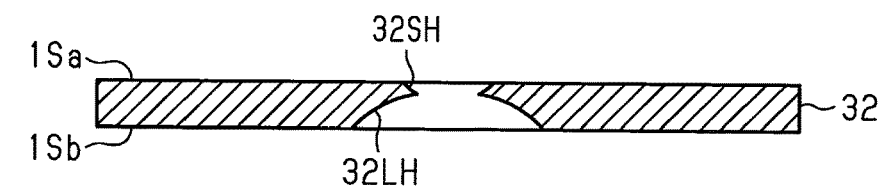

As shown in FIG. 19, removing the first protection layer 4 and the second DFR 3 from the vapor deposition mask substrate 1 provides the mask portion 32 having a plurality of small holes 32SH and large holes 32LH connected to the small holes 32SH.

In the manufacturing method using rolling, the vapor deposition mask substrate 1 includes some amount of a metallic oxide, such as an aluminum oxide or a magnesium oxide. That is, when the base material 1a is formed, a deoxidizer, such as granular aluminum or magnesium, is typically mixed into the material to limit mixing of oxygen into the base material 1a. The aluminum or magnesium remains to some extent in the base material 1a as a metallic oxide such as an aluminum oxide or a magnesium oxide. In this respect, the manufacturing method using electrolysis limits mixing of the metallic oxide into the mask portion 32.

[Method for Manufacturing Vapor Deposition Mask]

Various examples of a method for manufacturing a vapor deposition mask are now described. Referring to FIGS. 20A to 20H, an example of a method for forming holes by wet etching (the first manufacturing method) is described. Referring to FIGS. 21A to 21E, an example of a method for forming holes by electrolysis (the second manufacturing method) is described. Referring to FIGS. 22A to 22F, another example of a method for forming holes by electrolysis (the third manufacturing method) is described.

[First Manufacturing Method]

The method for manufacturing a vapor deposition mask including the mask portion 32 described with reference to FIG. 6 and the method for manufacturing a vapor deposition mask including the mask portion 32 described with reference to FIG. 7 involve substantially identical processes except for the step of etching a substrate 32K. The following description mainly focuses on the method for manufacturing a vapor deposition mask including the mask portion 32 shown in FIG. 6. The overlapping steps in the method for manufacturing a vapor deposition mask including the mask portion 32 shown in FIG. 7 are not described.

In the example of a method for manufacturing a vapor deposition mask shown in FIGS. 20A to 20H, a substrate 32K is first prepared (FIG. 20A). The substrate 32K is the vapor deposition mask substrate 1 to be processed as the mask plate 323 and preferably includes, in addition to the vapor deposition mask substrate 1, a support SP, which supports the vapor deposition mask substrate 1. The first surface 321 of the substrate 32K (the lower surface in FIGS. 20A to 20H) corresponds to the first surface 1Sa described above, and the second surface 322 of the substrate 32K (the upper surface in FIGS. 20A to 20H) corresponds to the second surface 1Sb described above.

A resist layer PR is formed on the second surface 322 of the prepared substrate 32K (FIG. 20B), and the resist layer PR undergoes exposure and development so that a resist mask RM is formed on the second surface 322 (FIG. 20C). Holes 32H are then formed in the substrate 32K by wet etching from the second surface 322 using the resist mask RM (FIG. 20D).

In this step, second openings H2 are formed in the second surface 322, where the wet etching starts, and first openings H1 smaller than the second openings H2 are formed in the first surface 321, which is subjected to the wet etching after the second surface 322. The resist mask RM is then removed from the second surface 322, leaving the mask portion 32 described above (FIG. 20E). Finally, the outer edge sections 32E of the second surface 322 are joined to the inner edge sections 31E of a frame portion 31, and the support SP is removed from the mask portion 32 to complete the vapor deposition mask 30 (FIGS. 20F to 20H).

In the method for manufacturing a vapor deposition mask including the mask portion 32 shown in FIG. 7, the steps described above are performed on the surface of a substrate 32K corresponding to the first surface 321 to form small holes 32SH. This substrate 32K does not include a support SP. The small holes 32SH are then filled with a material for protecting the small holes 32SH, such as a resist. Then, the steps described above are performed on the surface of the substrate 32K corresponding to the second surface 322, thereby forming a mask portion 32.

The example shown in FIG. 20F uses resistance welding to join the outer edge sections 32E of the second surface 322 to the inner edge sections 31E of the frame portion 31. This method forms a plurality of holes SPH in an insulative support SP. The holes SPH are formed in the sections of the support SP that face the sections that become joining sections 32BN. Then, the joining sections 32BN are formed separately by energization through the holes SPH. This welds the outer edge sections 32E to the inner edge sections 31E.

The example shown in FIG. 20G uses laser welding to join the outer edge sections 32E of the second surface 322 to the inner edge sections 31E of the frame portion 31. This method uses a light transmitting support SP and irradiates the sections that become joining sections 32BN with laser light L through the support SP. Separate joining sections 32BN are formed by intermittently applying laser light L around the outer edge section 32E. Alternatively, a continuous joining section 32BN is formed along the entire circumference of the outer edge section 32E by continuously applying laser light L around the outer edge sections 32E. This welds the outer edge sections 32E to the inner edge sections 31E.

The example shown in FIG. 20H uses ultrasonic welding to join the outer edge sections 32E of the second surface 322 to the inner edge sections 31E of the frame portion 31. This method applies ultrasonic waves to the sections that become joining sections 32BN with the outer edge sections 32E and the inner edge sections 31E held together by clamps CP or other device. The member to which ultrasonic waves are directly applied may be the frame portion 31 or the mask portion 32. The method using ultrasonic welding leaves crimp marks of the clamps CP in the frame portion 31 and the support SP.

In the joining process described above, fusing or welding may be performed while stress is acting on the mask portion 32 outward of the mask portion 32. When the support SP supports the mask portion 32 while stress is acting on the mask portion 32 outward of the mask portion 32, the application of stress to the mask portion 32 may be omitted.

[Second Manufacturing Method]

In addition to the first manufacturing method, the vapor deposition masks described with reference to FIGS. 8 and 9 may be manufactured by another example shown in FIGS. 21A to 21E.

The example shown in FIGS. 21A to 21E first forms a resist layer PR on an electrode surface EPS, which is a surface of an electrode EP used for electrolysis (see FIG. 21A). Then, the resist layer PR undergoes exposure and development so that a resist mask RM is formed on the electrode surface EPS (see FIG. 21B). The resist mask RM includes the shape of a reverse truncated cone in a cross-section perpendicular to the electrode surface EPS. The cross-sectional area of each shape along the electrode surface EPS increases away from the electrode surface EPS. Then, electrolysis is performed using the electrode surface EPS having the resist mask RM, and a mask portion 32 is formed over the region on the electrode surface EPS other than the resist mask RM (FIG. 21C).

In this step, the mask portion 32 is formed in the space that is not occupied by the resist mask RM. Accordingly, the mask portion 32 includes holes shaped corresponding to the shape of the resist mask RM. Self-aligned holes 32H are thus formed in the mask portion 32. The surface in contact with the electrode surface EPS functions as the first surface 321 having the first openings H1, and the outermost surface having second openings H2, which are larger than the first openings H1, functions as the second surface 322.

Then, only the resist mask RM is removed from the electrode surface EPS, leaving holes 32H, which are hollows extending from the first openings H1 to the second openings H2 (see FIG. 21D). Finally, the joining surface 311 of the inner edge section 31E is joined to the outer edge section 32E of the second surface 322 including second openings H2, and then stress is applied to the frame portion 31 to peel off the mask portion 32 from the electrode surface EPS. The vapor deposition mask 30 in which the mask portion 32 is joined to the frame portion 31 is thus manufactured (FIG. 21E).

In the second manufacturing method, the mask portion 32 is formed without etching the vapor deposition mask substrate 1. When the outer edge section 32E satisfies Condition 1, with the direction along one side of the mask portion 32 being the width direction, the positional accuracy in the joining between the frame portion 31 and the mask portion 32 and the strength of the joining are increased.

[Third Manufacturing Method]

In addition to the first manufacturing method, the vapor deposition masks described with reference to FIGS. 8 and 9 may be manufactured by another example shown in FIGS. 22A to 22F.

The example shown in FIGS. 22A to 22E first forms a resist layer PR on an electrode surface EPS, which is used for electrolysis (see FIG. 22A). Then, the resist layer PR undergoes exposure and development so that a resist mask RM is formed on the electrode surface EPS (see FIG. 22B). The resist mask RM includes the shape of a truncated cone in a cross-section perpendicular to the electrode surface EPS. The cross-sectional area of each shape along the electrode surface EPS decreases away from the electrode surface EPS. Then, electrolysis is performed using the electrode surface EPS having the resist mask RM, and a mask portion 32 is formed over the region on the electrode surface EPS other than the resist mask RM (FIG. 22C).

In this step, the mask portion 32 is formed in the space that is not occupied by the resist mask RM. Accordingly, the mask portion 32 includes holes shaped corresponding to the shape of the resist mask RM. Self-aligned holes 32H are thus formed in the mask portion 32. The surface in contact with the electrode surface EPS functions as the second surface 322 having the second openings H2, and the outermost surface having the first openings H1, which are smaller than the second openings H2, functions as the first surface 321.

Then, only the resist mask RM is removed from the electrode surface EPS, leaving holes 32H, which are hollows extending from the first openings H1 to the second openings H2 (see FIG. 22D). An intermediate transfer substrate TM is joined to the first surface 321 including the first openings H1, and stress is then applied to the intermediate transfer substrate TM to peel off the mask portion 32 from the electrode surface EPS. This separates the second surface 322 from the electrode surface EPS with the mask portion 32 joined to the intermediate transfer substrate TM (FIG. 22E). Finally, the joining surface 311 of the inner edge section 31E is joined to the outer edge section 32E of the second surface 322, and then the intermediate transfer substrate TM is removed from the mask portion 32. The vapor deposition mask 30 in which the mask portion 32 is joined to the frame portion 31 is thus manufactured (FIG. 22F).

In the third manufacturing method, the mask portion 32 is formed without etching the vapor deposition mask substrate material 1. When the outer edge section 32E satisfies Condition 1, with the direction along one side of the mask portion 32 being the width direction, the positional accuracy in the joining between the frame portion 31 and the mask portion 32 and the strength of the joining are increased.

In the method for manufacturing a display device using the vapor deposition mask 30 described above, the mask device 10 to which the vapor deposition mask 30 is mounted is set in the vacuum chamber of the vapor deposition apparatus. The mask device 10 is attached such that the first surface 321 faces the vapor deposition target, such as a glass substrate, and the second surface 322 faces the vapor deposition source. Then, the vapor deposition target is transferred into the vacuum chamber of the vapor deposition apparatus, and the vapor deposition material is sublimated from the vapor deposition source. This forms a pattern that is shaped corresponding to the first opening H1 on the vapor deposition target, which faces the first opening H1. The vapor deposition material may be an organic light-emitting material for forming pixels of a display device, or a pixel electrode for forming a pixel circuit of a display device, for example.

EXAMPLES

Referring to FIGS. 23 to 39, Examples are now described.

Example 1

A base material 1a, which was made of Invar, was subjected to a rolling step to form a metal sheet. The metal sheet was subjected to a slitting step of cutting the metal sheet into sections of the desired dimension in the width direction DW to form a rolled material 1b. The rolled material 1b was annealed to form a vapor deposition mask substrate 1 of Example 1, which had a length in the width direction DW of 500 mm and a thickness of 20 µm.

Figure 23:
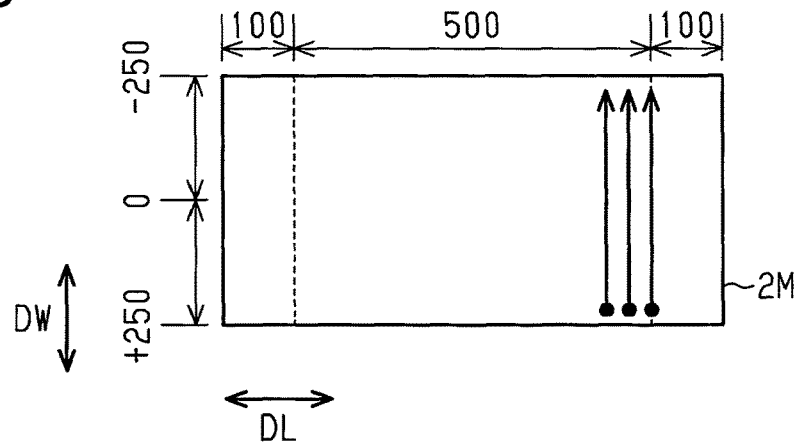
FIG. 23 is a plan view showing the planar structure of a measurement substrate of an example together with dimensions.

As shown in FIG. 23, a measurement substrate 2M of Example 1 was cut out from the vapor deposition mask substrate 1 of Example 1. The measurement substrate 2M had a length in the longitudinal direction DL of 700 mm. Then, the elongation difference ratios in the width direction DW of the measurement substrate 2M were measured over the entire measurement area ZL. The measurement conditions of elongation difference ratios in the width direction DW were as follows.

Measurement device: CNC image measurement system VMR-6555 manufactured by Nikon Corporation Length in the longitudinal direction DL of measurement area ZL: 500 mm (unit length)

Length in the longitudinal direction DL of non-measurement area ZE: 100 mm

Measurement interval in the longitudinal direction DL: 1 mm or 20 mm

Measurement interval in the width direction DW: 20 mm or 1 mm

To exclude the undulated shape added in the slitting step, measurement in the width direction was performed for the area of 480 mm in the width direction DW excluding the areas of 10 mm from the edges in the width direction DW.

Figure 24:
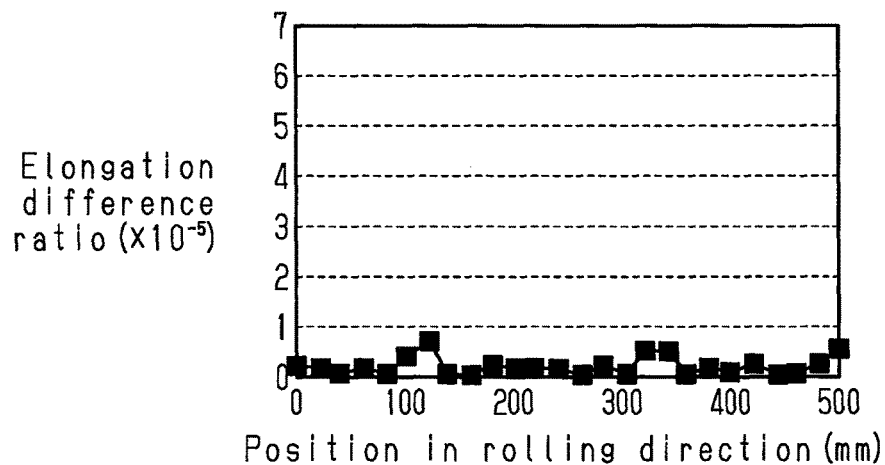
FIGS. 24 and 25 are graphs for illustrating the distribution in the longitudinal direction of elongation difference ratios in the width direction of Example 1.
Figure 25:
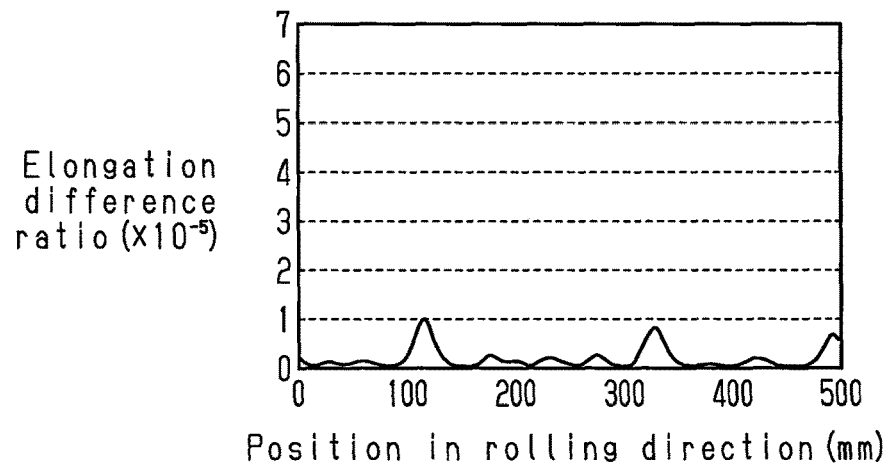

FIGS. 24 and 25 and Table 1 show the measurement result of elongation difference ratios in the width direction DW of Example 1. FIG. 24 shows the distribution of elongation difference ratios in the longitudinal direction obtained using a measurement interval in the longitudinal direction DL of 20 mm and a measurement interval in the width direction DW of 20 mm. FIG. 25 shows the distribution of elongation difference ratios in the longitudinal direction obtained using a measurement interval in the longitudinal direction DL of 1 mm and a measurement interval in the width direction DW of 20 mm. Table 1 shows the maximum value of elongation difference ratios in the longitudinal direction obtained using a measurement interval in the longitudinal direction DL of 20 mm and a measurement interval in the width direction DW of 1 mm. With any of the measurement intervals, the longitudinal direction DL is the direction in which the base material 1a was stretched by rolling.

Table 1 shows that the maximum value of elongation difference ratios in the width direction DW of Example 1 was $1.0\times10^{-5}$ when the measurement interval in the longitudinal direction DL was 20 mm and the measurement interval in the width direction DW was 1 mm.

FIG. 24 shows that the maximum value of elongation difference ratios in the width direction DW of Example 1 was $0.7\times10^{-5}$ when the measurement interval in the longitudinal direction DL was 20 mm and the measurement interval in the width direction DW was 20 mm. The average value of elongation difference ratios per unit length was $0.2\times10^{-3}$, and the standard deviation σ of elongation difference ratio per unit length was $0.19\times10^{-3}$. Two peaks were observed per unit length. The distance between adjacent peaks was 220 mm.

FIG. 25 shows that the maximum value of elongation difference ratios in the width direction DW of Example 1 was $0.9\times10^{-5}$ when the measurement interval in the longitudinal direction DL was 1 mm and the measurement interval in the width direction DW was 20 mm. The average value of elongation difference ratios per unit length was $0.2\times10^{-3}$, and the standard deviation σ of elongation difference ratio per unit length was $0.21\times10^{-3}$. Three peaks were observed per unit length. The minimum value of distances between adjacent peaks was 166 mm. That is, Example 1 satisfied Conditions 1 to 4 with all the measurement intervals.

Example 2

A vapor deposition mask substrate 1 of Example 2 having a length in the width direction DW of 500 mm and a thickness of 20 μm was obtained under the same conditions as Example 1 except that the rotation speed and pressing force of the rolls 51 and 52 were changed from those in Example 1. A measurement substrate 2M was cut out from the vapor deposition mask substrate 1 of Example 2 in the same manner as Example 1, and elongation difference ratios in the width direction DW of the obtained measurement substrate 2M were measured over the entire measurement area ZL.

Figure 26:
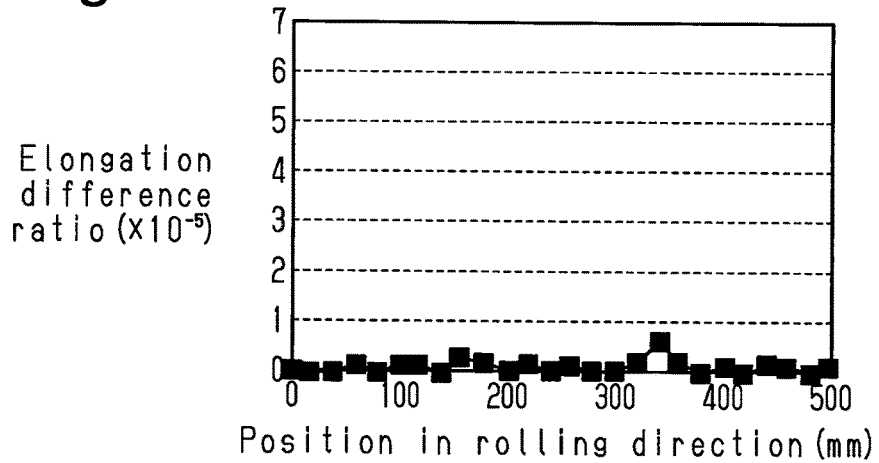
FIGS. 26 to 28 are graphs for illustrating the distribution in the longitudinal direction of elongation difference ratios in the width direction of Example 2.
Figure 27:
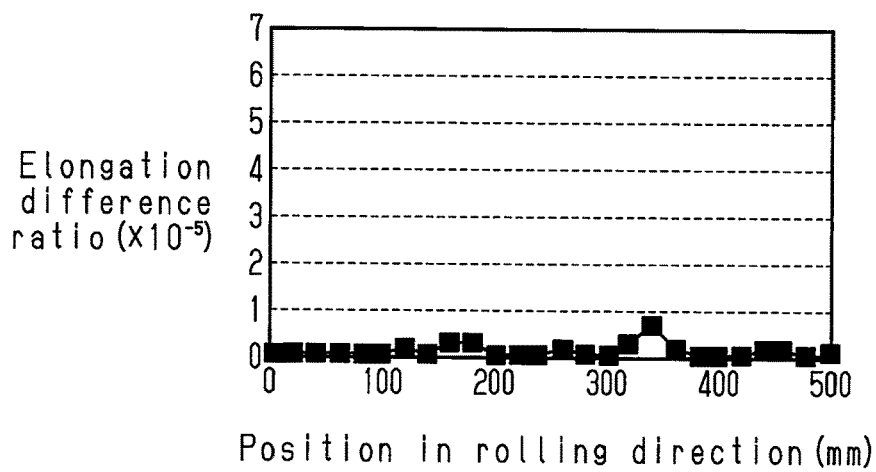
Figure 28:
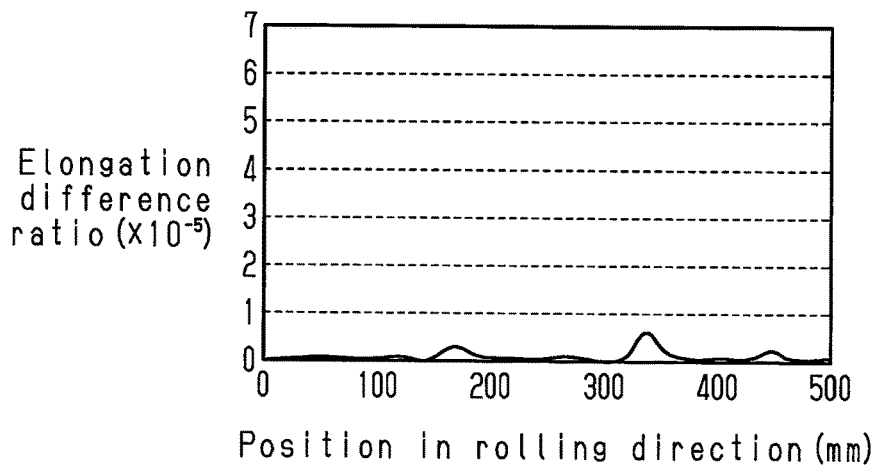

FIGS. 26 to 28 and Table 1 show the measurement result of elongation difference ratios in the width direction DW of Example 2. FIG. 26 shows the distribution of elongation difference ratios in the longitudinal direction obtained using a measurement interval in the longitudinal direction DL of 20 mm and a measurement interval in the width direction DW of 20 mm. FIG. 27 shows the distribution of elongation difference ratios in the longitudinal direction obtained using a measurement interval in the longitudinal direction DL of 20 mm and a measurement interval in the width direction DW of 1 mm. FIG. 28 shows the distribution of elongation difference ratios in the longitudinal direction obtained using a measurement interval in the longitudinal direction DL of 1 mm and a measurement interval in the width direction DW of 20 mm. Table 1 shows the maximum value of the elongation difference ratios in the longitudinal direction obtained using a measurement interval in the longitudinal direction DL of 20 mm and a measurement interval in the width direction DW of 1 mm. With any of the measurement intervals, the longitudinal direction DL is the direction in which the base material 1a was stretched by rolling.

Table 1 shows that the maximum value of elongation difference ratios in the width direction DW of Example 2 was $0.7\times10^{-5}$ when the measurement interval in the longitudinal direction DL was 20 mm and the measurement interval in the width direction DW was 1 mm.

FIG. 26 shows that the maximum value of elongation difference ratios in the width direction DW of Example 2 was $0.6\times10^{-5}$ when the measurement interval in the longitudinal direction DL was 20 mm and the measurement interval in the width direction DW was 20 mm. The average value of elongation difference ratios per unit length was $0.1\times10^{-5}$, and the standard deviation σ of elongation difference ratio per unit length was $0.12\times10^{-5}$. One peak was observed per unit length.

FIG. 27 shows that the maximum value of elongation difference ratios in the width direction DW of Example 2 was $0.7\times10^{-5}$ when the measurement interval in the longitudinal direction DL was 20 mm and the measurement interval in the width direction DW was 1 mm. The average value of elongation difference ratios per unit length was $0.1\times10^{-5}$, and the standard deviation σ of elongation difference ratio per unit length was $0.14\times10^{-5}$. One peak was observed per unit length.

FIG. 28 shows that the maximum value of elongation difference ratios in the width direction DW of Example 2 was $0.6\times10^{-5}$ when the measurement interval in the longitudinal direction DL was 1 mm and the measurement interval in the width direction DW was 20 mm. The average value of elongation difference ratios per unit length was $0.1\times10^{-5}$, and the standard deviation σ of elongation difference ratio per unit length was $0.12\times10^{-5}$. One peak was observed per unit length. That is, Example 2 satisfied Conditions 1 to 4 with all the measurement intervals.

Example 3

The vapor deposition mask substrate 1 of Example 3 having a length in the width direction DW of 500 mm and a thickness of 50 μm was obtained under the same conditions as Example 1 except that the pressing force between the rolls 51 and 52 was changed from that in Example 1. A measurement substrate 2M was cut out from the vapor deposition mask substrate 1 of Example 3 in the same manner as Example 1, and elongation difference ratios in the width direction DW of the obtained measurement substrate 2M were measured over the entire measurement area ZL.

Figure 29:
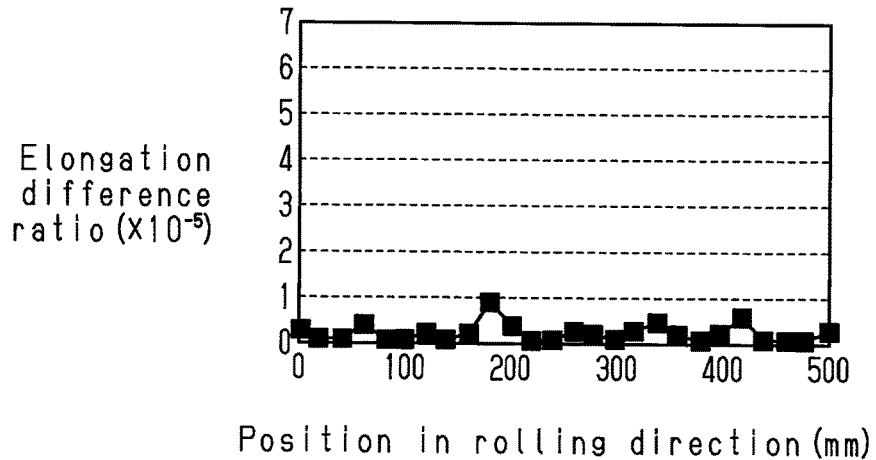
FIGS. 29 and 30 are graphs for illustrating the distribution in the longitudinal direction of elongation difference ratios in the width direction of Example 3.
Figure 30:
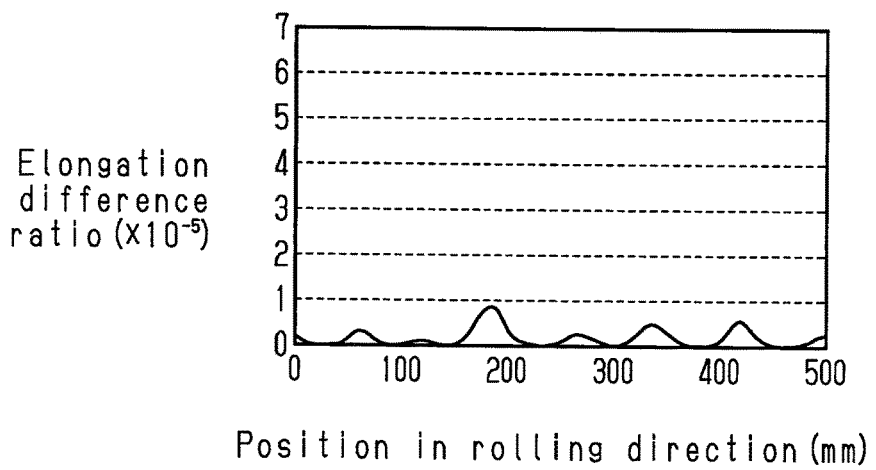

FIGS. 29 and 30 and Table 1 show the measurement result of elongation difference ratios in the width direction DW of Example 3. FIG. 29 shows the distribution of elongation difference ratios in the longitudinal direction obtained using a measurement interval in the longitudinal direction DL of 20 mm and a measurement interval in the width direction DW of 20 mm. FIG. 30 shows the distribution of elongation difference ratios in the longitudinal direction obtained using a measurement interval in the longitudinal direction DL of 1 mm and a measurement interval in the width direction DW of 20 mm. Table 1 shows the maximum value of the elongation difference ratios in the longitudinal direction obtained using a measurement interval in the longitudinal direction DL of 20 mm and a measurement interval in the width direction DW of 1 mm. With any of the measurement intervals, the longitudinal direction DL is the direction in which the base material 1a was stretched by rolling.

Table 1 shows that the maximum value of elongation difference ratios in the width direction DW of Example 3 was $0.9 \times 10^{-5}$ when the measurement interval in the longitudinal direction DL was 20 mm and the measurement interval in the width direction DW was 1 mm.

FIG. 29 shows the maximum value of elongation difference ratios in the width direction DW of Example 3 was $0.8 \times 10^{-5}$ when the measurement interval in the longitudinal direction DL was 20 mm and the measurement interval in the width direction DW was 20 mm. The average value of elongation difference ratios per unit length was $0.2 \times 10^{-3}$, and the standard deviation σ of elongation difference ratio per unit length was $0.20 \times 10^{-3}$. Two peaks were observed per unit length. The minimum value of distances between adjacent peaks was 240 mm.

FIG. 30 shows that the maximum value of elongation difference ratios in the width direction DW of Example 3 was $0.8 \times 10^{-3}$ when the measurement interval in the longitudinal direction DL was 1 mm and the measurement interval in the width direction DW was 20 mm. The average value of elongation difference ratios per unit length was $0.2 \times 10^{-3}$, and the standard deviation σ of elongation difference ratio per unit length was $0.19 \times 10^{-3}$. Two peaks were observed per unit length. The minimum value of distances between adjacent peaks was 240 mm. That is, Example 3 satisfied Conditions 1 to 4 with all the measurement intervals.

Example 4

A vapor deposition mask substrate 1 of Example 4 having a length in the width direction DW of 500 mm and a thickness of 20 μm was obtained under the same conditions as Example 1 except that the number of rolls 51 and 52 was changed from that in Example 1. A measurement substrate 2M was cut out from the vapor deposition mask substrate 1 of Example 4 in the same manner as Example 1, and elongation difference ratios in the width direction DW of the obtained measurement substrate 2M were measured over the entire measurement area ZL.

Figure 31:
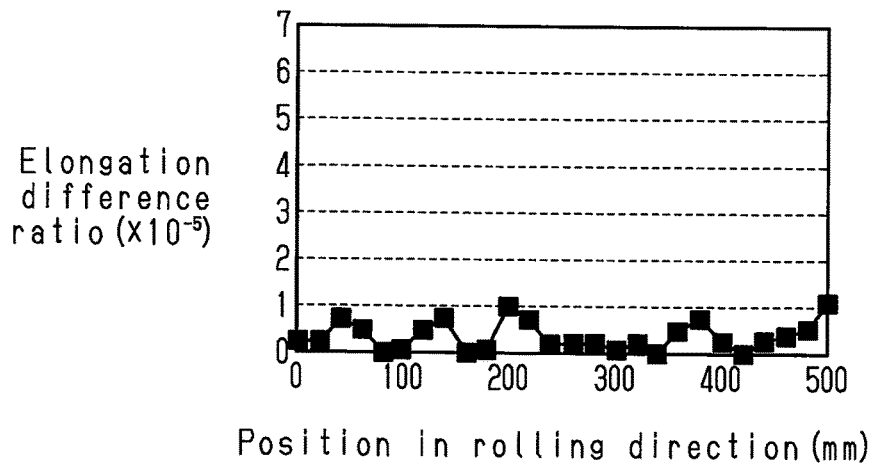
FIGS. 31 and 32 are graphs for illustrating the distribution in the longitudinal direction of elongation difference ratios in the width direction of Example 4.
Figure 32:
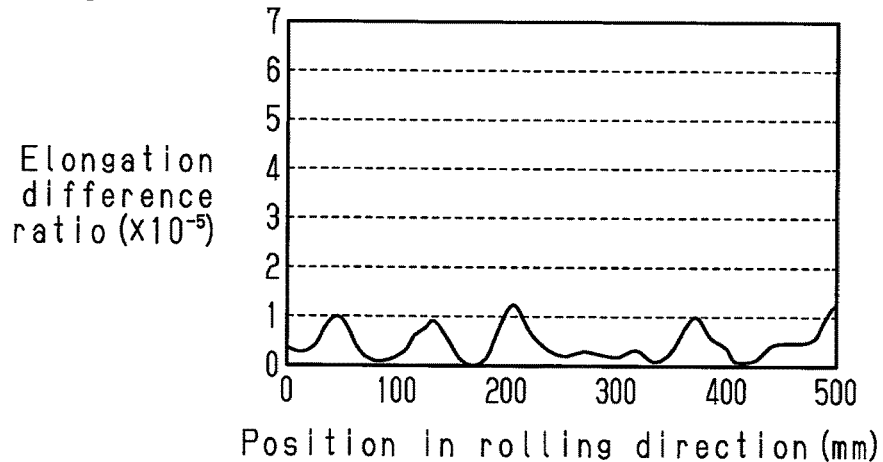

FIGS. 31 and 32 and Table 1 show the measurement result of elongation difference ratios in the width direction DW of Example 4. FIG. 31 shows the distribution of elongation difference ratios in the longitudinal direction obtained using a measurement interval in the longitudinal direction DL of 20 mm and the measurement interval in the width direction DW of 20 mm. FIG. 32 shows the distribution of elongation difference ratios in the longitudinal direction obtained using a measurement interval in the longitudinal direction DL of 1 mm and a measurement interval in the width direction DW of 20 mm. Table 1 shows the maximum value of the elongation difference ratios in the longitudinal direction obtained using a measurement interval in the longitudinal direction DL of 20 mm and a measurement interval in the width direction DW of 1 mm. With any of the measurement intervals, the longitudinal direction DL is the direction in which the base material 1a was stretched by rolling.

Table 1 shows that the maximum value of elongation difference ratios in the width direction DW of Example 4 was $1.4 \times 10^{-3}$ when the measurement interval in the longitudinal direction DL was 20 mm and the measurement interval in the width direction DW was 1 mm.

FIG. 31 shows the maximum value of elongation difference ratios in the width direction DW of Example 4 was $1.1 \times 10^{-3}$ when the measurement interval in the longitudinal direction DL was 20 mm and the measurement interval in the width direction DW was 20 mm. The average value of elongation difference ratios per unit length was $0.4 \times 10^{-3}$, and the standard deviation σ of elongation difference ratio per unit length was $0.31 \times 10^{-3}$. Four peaks were observed per unit length. The minimum value of distances between adjacent peaks was 60 mm.

FIG. 32 shows that the maximum value of elongation difference ratios in the width direction DW of Example 4 was $1.2 \times 10^{-3}$ when the measurement interval in the longitudinal direction DL was 1 mm and the measurement interval in the width direction DW was 20 mm. The average value of elongation difference ratios per unit length was $0.4 \times 10^{-3}$, and the standard deviation σ of elongation difference ratio per unit length was $0.30 \times 10^{-3}$. Five peaks were observed per unit length. The minimum value of distances between adjacent peaks was 75 mm. That is, Example 4 satisfied Conditions 1 and 2 with all the measurement intervals.

Comparison Example 1

A vapor deposition mask substrate 1 of Comparison Example 1 having a length in the width direction DW of 500 mm and a thickness of 20 μm was obtained under the same conditions as Example 1 except that the number and temperature of the rolls 51 and 52 were changed from those in Examples 1 and 4. A measurement substrate 2M was cut out from the vapor deposition mask substrate 1 of Comparison Example 1 in the same manner as Example 1, and elongation difference ratios in the width direction DW of the obtained measurement substrate 2M were measured over the entire measurement area ZL.

Figure 33:
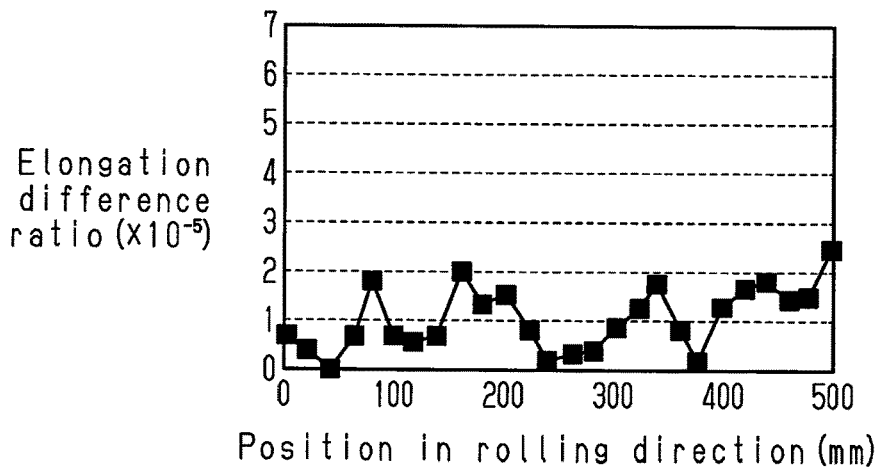
FIGS. 33 and 34 are graphs for illustrating the distribution in the longitudinal direction of elongation difference ratios in the width direction of Comparison Example 1.
Figure 34:
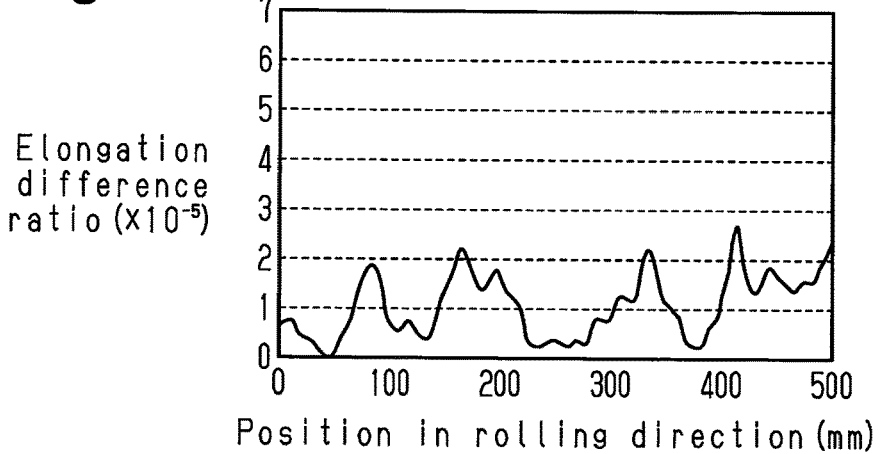

FIGS. 33 and 34 and Table 1 show the measurement result of elongation difference ratios in the width direction DW of Comparison Example 1. FIG. 33 shows the distribution of elongation difference ratios in the longitudinal direction obtained using a measurement interval in the longitudinal direction DL of 20 mm and a measurement interval in the width direction DW of 20 mm. FIG. 34 shows the distribution of elongation difference ratios in the longitudinal direction obtained using a measurement interval in the longitudinal direction DL of 1 mm and a measurement interval in the width direction DW of 20 mm. Table 1 shows the maximum value of the elongation difference ratios in the longitudinal direction obtained using a measurement interval in the longitudinal direction DL of 20 mm and a measurement interval in the width direction DW of 1 mm. With any of the measurement intervals, the longitudinal direction DL is the direction in which the base material 1a was stretched by rolling.

Table 1 shows that the maximum value of elongation difference ratios in the width direction DW of Comparison Example 1 was $3.0 \times 10^{-3}$ when the measurement interval in the longitudinal direction DL was 20 mm and the measurement interval in the width direction DW was 1 mm.

FIG. 33 shows that the maximum value of elongation difference ratios in the width direction DW of Comparison Example 1 was $2.5 \times 10^{-3}$ when the measurement interval in the longitudinal direction DL was 20 mm and the measurement interval in the width direction DW was 20 mm. The average value of elongation difference ratios per unit length was $1.0 \times 10^{-3}$, and the standard deviation $\sigma$ of elongation difference ratio per unit length was $0.67 \times 10^{-3}$. Five peaks were observed per unit length. The minimum value of distances between adjacent peaks was 40 mm.

FIG. 34 shows that the maximum value of elongation difference ratios in the width direction DW of Comparison Example 1 was $2.7 \times 10^{-3}$ when the measurement interval in the longitudinal direction DL was 1 mm and the measurement interval in the width direction DW was 20 mm. The average value of elongation difference ratios per unit length was $1.0 \times 10^{-3}$, and the standard deviation $\sigma$ of elongation difference ratio per unit length was $0.64 \times 10^{-3}$. Eleven peaks were observed per unit length. The minimum value of distances between adjacent peaks was 33 mm. That is, Comparison Example 1 failed to satisfy the conditions described above with all the measurement intervals.

Comparison Example 2

A vapor deposition mask substrate 1 of Comparison Example 2 having a length in the width direction DW of 500 mm and a thickness of 20 μm was obtained under the same conditions as Example 1 except that the number and the pressing force of rolls 51 and 52 were changed from those in Examples 1 and 3. A measurement substrate 2M was cut out from the vapor deposition mask substrate 1 of Comparison Example 2 in the same manner as Example 1, and elongation difference ratios in the width direction DW of the obtained measurement substrate 2M were measured over the entire measurement area ZL.

Figure 35:
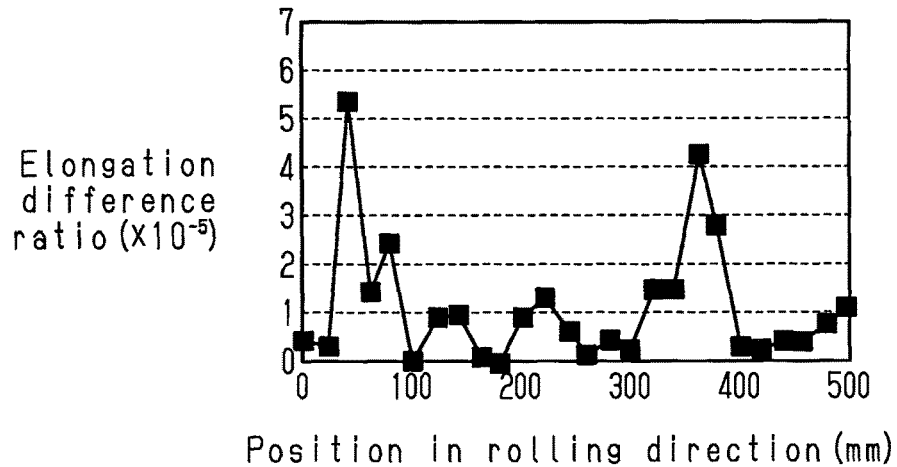
FIGS. 35 and 36 are graphs for illustrating the distribution in the longitudinal direction of elongation difference ratios in the width direction of Comparison Example 2.
Figure 36:
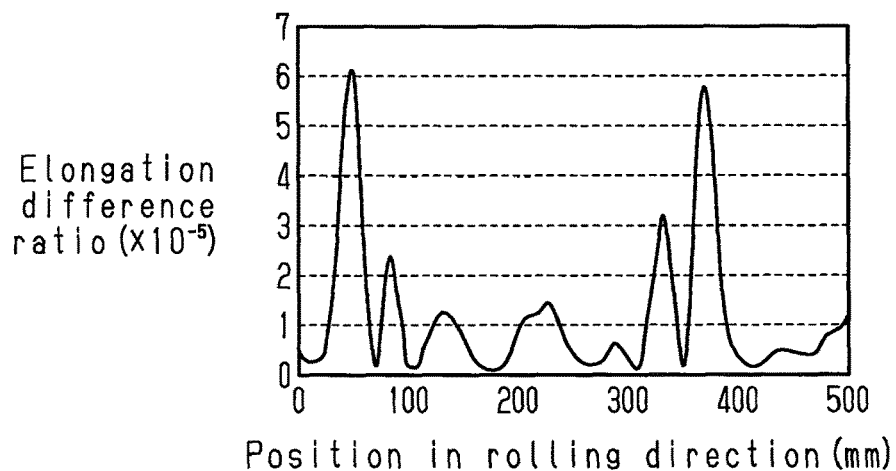

FIGS. 35 and 36 and Table 1 show the measurement result of elongation difference ratios in the width direction DW of Comparison Example 2. FIG. 35 shows the distribution of elongation difference ratios in the longitudinal direction obtained using a measurement interval in the longitudinal direction DL of 20 mm and a measurement interval in the width direction DW of 20 mm. FIG. 36 shows the distribution of elongation difference ratios in the longitudinal direction obtained using a measurement interval in the longitudinal direction DL of 1 mm and a measurement interval in the width direction DW of 20 mm. Table 1 shows the maximum value of the elongation difference ratios in the longitudinal direction obtained using a measurement interval in the longitudinal direction DL of 20 mm and a measurement interval in the width direction DW of 1 mm. With any of the measurement intervals, the longitudinal direction DL is the direction in which the base material 1a was stretched by rolling.

Table 1 shows that the maximum value of elongation difference ratios in the width direction DW of Comparison Example 2 was $6.5 \times 10^{-5}$ when the measurement interval in the longitudinal direction DL was 20 mm and the measurement interval in the width direction DW was 1 mm.

FIG. 35 shows that the maximum value of elongation difference ratios in the width direction DW of Comparison Example 2 was $5.3 \times 10^{-3}$ when the measurement interval in the longitudinal direction DL was 20 mm and the measurement interval in the width direction DW was 20 mm. The average value of elongation difference ratios per unit length was $1.1 \times 10^{-3}$, and the standard deviation $\sigma$ of elongation difference ratio per unit length was $1.30 \times 10^{-3}$. Six peaks were observed per unit length. The minimum value of distances between adjacent peaks was 40 mm.

FIG. 36 shows that the maximum value of elongation difference ratios in the width direction DW of Comparison Example 2 was $6.1 \times 10^{-3}$ when the measurement interval in the longitudinal direction DL was 1 mm and the measurement interval in the width direction DW was 20 mm. The average value of elongation difference ratios per unit length was $1.1 \times 10^{-3}$, and the standard deviation $\sigma$ of elongation difference ratio per unit length was $1.37 \times 10^{-3}$. Seven peaks were observed per unit length. The minimum value of distances between adjacent peaks was 33 mm. That is, Comparison Example 2 failed to satisfy the conditions with all the measurement intervals.

Comparison Example 3

A vapor deposition mask substrate 1 of Comparison Example 3 having a length in the width direction DW of 500 mm and a thickness of 20 μm was obtained under the same conditions as Example 1 except that the number and the pressing force of rolls 51 and 52 were changed from those in Example 1. A measurement substrate 2M was cut out from the vapor deposition mask substrate 1 of Comparison Example 3 in the same manner as Example 1, and elongation difference ratios in the width direction DW of the obtained measurement substrate 2M were measured over the entire measurement area ZL.

Figure 37:
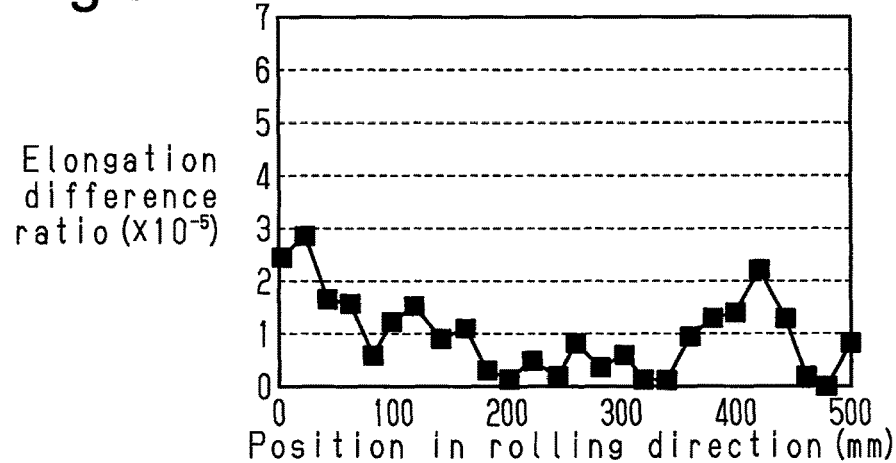
FIGS. 37 to 39 are graphs for illustrating the distribution in the longitudinal direction of elongation difference ratios in the width direction of Comparison Example 3.
Figure 38:
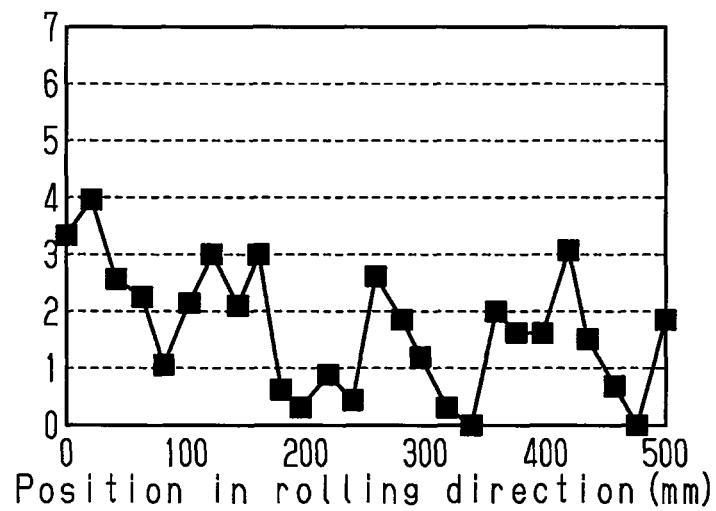
Figure 39:
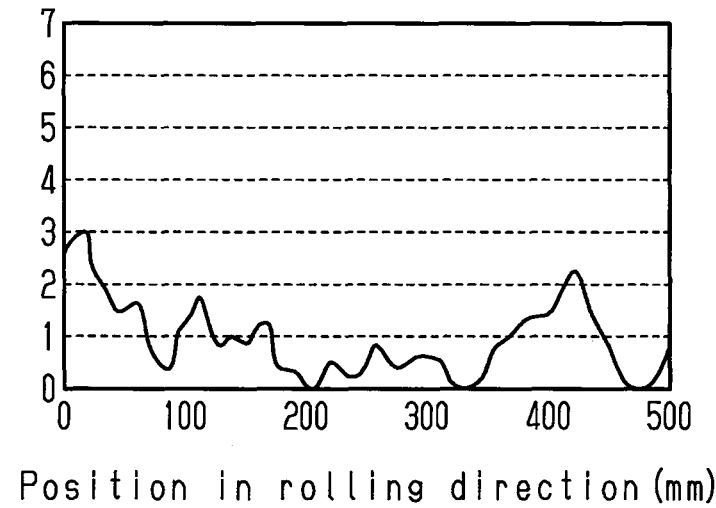

FIGS. 37, 38 and 39 and Table 1 show the measurement result of elongation difference ratios in the width direction DW of Comparison Example 3. FIG. 37 shows the distribution of elongation difference ratios in the longitudinal direction obtained using a measurement interval in the longitudinal direction DL of 20 mm and a measurement interval in the width direction DW of 20 mm. FIG. 38 shows the distribution of elongation difference ratios in the longitudinal direction obtained using a measurement interval in the longitudinal direction DL of 20 mm and a measurement interval in the width direction DW of 1 mm. FIG. 39 shows the distribution of elongation difference ratios in the longitudinal direction obtained using a measurement interval in the longitudinal direction DL of 1 mm and a measurement interval in the width direction DW of 20 mm. Table 1 shows the maximum value of the elongation difference ratios in the longitudinal direction obtained using a measurement interval in the longitudinal direction DL of 20 mm and a measurement interval in the width direction DW of 1 mm. With any of the measurement intervals, the longitudinal direction DL is the direction in which the base material 1a was stretched by rolling.

Table 1 shows that the maximum value of elongation difference ratios in the width direction DW of Comparison Example 3 was $3.9 \times 10^{-3}$ when the measurement interval in the longitudinal direction DL was 20 mm and the measurement interval in the width direction DW was 1 mm.

FIG. 37 shows that the maximum value of elongation difference ratios in the width direction DW of Comparison Example 3 was $2.9 \times 10^{-3}$ when the measurement interval in the longitudinal direction DL was 20 mm and the measurement interval in the width direction DW was 20 mm. The average value of elongation difference ratios per unit length was $1.0 \times 10^{-3}$, and the standard deviation σ of elongation difference ratio per unit length was $0.77 \times 10^{-3}$. Six peaks were observed per unit length. The minimum value of distances between adjacent peaks was 40 mm.

FIG. 38 shows that the maximum value of elongation difference ratios in the width direction DW of Comparison Example 3 was $3.9 \times 10^{-3}$ when the measurement interval in the longitudinal direction DL was 20 mm and the measurement interval in the width direction DW was 1 mm. The average value of elongation difference ratios per unit length was $1.6 \times 10^{-3}$, and the standard deviation σ of elongation difference ratio per unit length was $1.10 \times 10^{-3}$. Seven peaks were observed per unit length. The minimum value of distances between adjacent peaks was 40 mm.

FIG. 39 shows that the maximum value of elongation difference ratios in the width direction DW of Comparison Example 3 was $3.0 \times 10^{-3}$ when the measurement interval in the longitudinal direction DL was 1 mm and the measurement interval in the width direction DW was 20 mm. The average value of elongation difference ratios per unit length was $1.0 \times 10^{-3}$, and the standard deviation σ of elongation difference ratio per unit length was $0.73 \times 10^{-3}$. Eleven peaks were observed per unit length. That is, Comparison Example 3 failed to satisfy the conditions with all the measurement intervals. The maximum value of distances between adjacent peaks was 94 mm, and the average value was 41 mm.

TABLE 1

| Item | Thickness | Elongation Difference Ratio $\times 10^{-5}$ | Variation |
|---|---|---|---|
| Example 1 | 20 μm | 1.0 | ○ |
| Example 2 | 20 μm | 0.7 | ○ |
| Example 3 | 50 μm | 0.9 | ○ |
| Example 4 | 20 μm | 1.4 | ○ |
| Comparison Example 1 | 20 μm | 3.0 | X |
| Comparison Example 2 | 20 μm | 6.5 | X |
| Comparison Example 3 | 20 μm | 3.9 | X |

[Pattern Accuracy]

A first DFR 2 having a thickness of 10 μm was affixed to the first surface 1Sa of the vapor deposition mask substrate 1 of each of Examples 1 to 4 and Comparison Examples 1 to 3. Each first DFR 2 underwent an exposure step, in which the first DFR 2 was exposed to light while in contact with an exposure mask, and a development step. This formed through-holes 2a having a diameter of 30 μm in the first DFR 2 in a grid pattern. Then, the first surface 1Sa was etched using the first DFR 2 as the mask so that holes 32H were formed in the vapor deposition mask substrate 1 in a grid pattern. The diameter of the opening of each hole 32H was measured in the width direction DW of the vapor deposition mask substrate 1. Table 1 shows the variations in diameter of the openings of the holes 32H in the width direction DW. In Table 1, the levels in which the difference between the maximum value and the minimum value of opening diameters of the holes 32H is less than or equal to 2.0 μm are marked with "○", and the levels in which the difference between the maximum value and the minimum value of opening diameters is greater than 2.0 μm are marked with "x".

As shown in Table 1, the variations in diameter of the openings of Examples 1 to 4 were less than or equal to 2.0 μm. Of Examples 1 to 4, Examples 1 to 3 had smaller variations in diameter of the openings than that of Example 4. Further, the variations in diameter of the openings of Comparison Examples 1 to 3 were greater than 2.0 μm. The comparison between Examples 1 and 4 and Comparison Examples 1 to 3 shows that a structure in which the maximum value of elongation difference ratios in the width direction DW is less than or equal to $2.0 \times 10^{-3}$, that is, a structure that satisfies Condition 1, limits variation in diameter of openings. In addition, the comparison between Examples 1 to 3 and Example 4 shows that a smaller average value of elongation difference ratios per unit length in the width direction DW further reduces variations in diameter of openings. Variations in diameter of openings are further reduced when the number of peaks per unit length is small and satisfies Condition 3 and the distances between peaks per unit length are small and satisfy Condition 4.

The above-described embodiment has the following advantages.

(1) The increased accuracy of the shape and size of the holes in the mask portion 32 increases the accuracy of the pattern formed by vapor deposition. The method for exposing the resist is not limited to a method of bringing the exposure mask into contact with the resist. The exposure may be performed without bringing the resist into contact with the exposure mask. Bringing the resist into contact with the exposure mask presses the vapor deposition mask substrate onto the surface of the exposure mask. This limits reduction in the accuracy of exposure, which would otherwise occur due to the undulated shape of the vapor deposition mask substrate. The accuracy in the step of processing the surface with liquid is increased regardless of the exposure method, thereby increasing the accuracy of the pattern formed by vapor deposition.

(2) The surface of the vapor deposition mask substrate 1 has limited variation in the result of development using a developing solution and the result of cleaning using a cleaning solution. This increases the uniformity of the shape and size of the first and second through-holes 2a and 3a, which are formed by the exposure step and the development step, in the surface of the vapor deposition mask substrate 1.

(3) The surface of the vapor deposition mask substrate 1 has limited variation in the result of etching using an etchant and the result of cleaning of the etchant using a cleaning solution. The surface of the vapor deposition mask substrate 1 has limited variation in the result of stripping of the resist layer using a stripping solution and the result of cleaning of the stripping solution using a cleaning solution. This increases the uniformity of the shape and size of the small holes 32SH and the large holes 32LH in the surface of the vapor deposition mask substrate 1.

(4) The quantity of holes 32H required in one frame portion 31 is divided into three mask portions 32. That is, the total area of the mask portions 32 required in one frame portion 31 is divided into three mask portions 32, for example. Thus, any partial deformation of a mask portion 32 in a frame portion 31 does not require replacement of all mask portions 32 in the frame portion 31. As compared with a structure in which one frame portion 31 includes only one mask portion 32, the size of a new mask portion 32 for replacing the deformed mask portion 32 may be reduced to about one-third.

(5) The elongation difference ratios of each measurement substrate 2M are measured with the sections at the two edges in the longitudinal direction DL of the measurement substrate 2M and the sections at the two edges in the width direction DW of the measurement substrate 2M excluded as non-measurement areas from the measurement target of elongation difference ratios. Each non-measurement area is the area that can have an undulated shape that is formed when the vapor deposition mask substrate 1 is cut and is thus differs from the undulated shape of the other section of the vapor deposition mask substrate 1. As such, excluding the non-measurement area from the measurement target will increase the accuracy of measurement of elongation difference ratios.

[Method for Manufacturing a Vapor Deposition Mask Substrate]

In the rolling step, a rolling mill may be used that includes a plurality of pairs of rolls, which rolls the base material 1a. The method using a plurality of pairs of rolls increases the flexibility in terms of the control parameters for satisfying Conditions 1 to 4.

Further, instead of annealing the rolled material 1b while extending it in the longitudinal direction DL, the rolled material 1b may be annealed in a state of being wound around the core C in a roll. When the annealing is performed on the rolled material 1b wound in a roll, the vapor deposition mask substrate 1 may have the tendency for warpage according to the diameter of the roll. Thus, depending on the material of the vapor deposition mask substrate 1 and the diameter of the roll wound around the core C, it may be preferable that the rolled material 1b be annealed while extended.

Further, the rolling step and the annealing step may be repeated and alternate to produce a vapor deposition mask substrate 1.

The vapor deposition mask substrate 1 produced by electrolysis and the vapor deposition mask substrate 1 produced by rolling may be further thinned by chemical or electrical polishing. The conditions such as the composition and the supplying method of the polishing solution may be set so as to satisfy Conditions 1 to 4 after polishing. To relax the internal stress, the polished vapor deposition mask substrate 1 may be subjected to an annealing step.

Although the multiple embodiments have been described herein, it will be clear to those skilled in the art that the present disclosure may be embodied in different specific forms without departing from the spirit of the disclosure. The disclosure is not to be limited to the details given herein, but may be modified within the scope and equivalence of the appended claims.

The invention claimed is:

1. A vapor deposition mask substrate, comprising:
a metal sheet that has a shape of a strip and is configured to be etched to include a plurality of holes and used to manufacture a vapor deposition mask, wherein
the metal sheet has a longitudinal direction and a width direction,
the metal sheet has shapes in the width direction that are taken at different positions in the longitudinal direction of the metal sheet and differ from one another,
each of the shapes comprises an undulated shape including protrusions and depressions repeating in the width direction of the metal sheet,
a length in the width direction of a surface of the metal sheet is a surface distance,
a minimum value of surface distances at different positions in the longitudinal direction of the metal sheet is a minimum surface distance,
a ratio of a difference between a surface distance and the minimum surface distance to the minimum surface distance is an elongation difference ratio in the width direction, and
a maximum value of elongation difference ratios is less than or equal to $2\times10^{-5}$.

2. The vapor deposition mask substrate according to claim 1, wherein
the vapor deposition mask substrate has a unit length in the longitudinal direction of 500 mm, and
an average value of elongation difference ratios per the unit length is less than or equal to $0.5\times10^{-5}$.

3. The vapor deposition mask substrate according to claim 1, wherein
the vapor deposition mask substrate has a unit length in the longitudinal direction of 500 mm, and
a number of peaks that have elongation difference ratios of greater than or equal to $0.5\times10^{-5}$ per the unit length is less than or equal to three.

4. The vapor deposition mask substrate according to claim 1, wherein
the vapor deposition mask substrate has a unit length in the longitudinal direction of 500 mm, and
a minimum value of distances between peaks that have elongation difference ratios of greater than or equal to $0.5\times10^{-5}$ per the unit length is greater than or equal to 100 mm.

5. A method for manufacturing a vapor deposition mask substrate according to claim 1, which comprises the metal sheet that has the shape of the strip and is configured to be etched to include the plurality of holes and used to manufacture the vapor deposition mask, the method comprising:
obtaining the metal sheet by rolling a base material such that
the metal sheet has the longitudinal direction and the width direction,
the metal sheet has shapes in the width direction that are taken at different positions in the longitudinal direction of the metal sheet and differ from one another,
each of the shapes comprises the undulated shape including protrusions and depressions repeating in the width direction of the metal sheet,
the length in the width direction of the surface of the metal sheet is the surface distance,
the minimum value of surface distances at different positions in the longitudinal direction of the metal sheet is the minimum surface distance,
the ratio of a difference between the surface distance and the minimum surface distance to the minimum surface distance is the elongation difference ratio in the width direction, and
the maximum value of elongation difference ratios is less than or equal to $2\times10^{-5}$.

6. A method for manufacturing a vapor deposition mask, the method comprising:
forming a resist layer on the metal sheet of claim 1 having the shape of the strip; and
forming a plurality of holes in the metal sheet by etching using the resist layer as a mask to form a mask portion, wherein
the metal sheet has the longitudinal direction and the width direction, the metal sheet has shapes in the width direction that are taken at different positions in the longitudinal direction of the metal sheet and differ from one another, each of the shapes comprises the undulated shape including protrusions and depressions repeating in the width direction of the metal sheet, the length in the width direction of the surface of the metal sheet is the surface distance, the minimum value of surface distances at different positions in the longitudinal direction of the metal sheet is the minimum surface distance, the ratio of a difference between the surface distance and the minimum surface distance to the minimum surface distance is the elongation difference ratio in the width direction, and the maximum value of elongation difference ratios is less than or equal to $2 \times 10^{-5}$.

7. The method for manufacturing a vapor deposition mask according to claim 6, wherein the mask portion is one of a plurality of mask portions, forming the mask portion includes forming the mask portions on the single metal sheet, the mask portions each include a separate side surface including some of the holes, and the method further comprises joining the side surfaces of the mask portions to a single frame portion such that the single frame portion surrounds the holes of each mask portion.

8. A method for manufacturing a display device, the method comprising:

preparing a vapor deposition mask manufactured by the method for manufacturing a vapor deposition mask according to claim 6; and forming a pattern by vapor deposition using the vapor deposition mask.

* * * * *